(12) United States Patent
Matsuoka et al.

(10) Patent No.: US 10,311,931 B2
(45) Date of Patent: Jun. 4, 2019

(54) SEMICONDUCTOR MEMORY DEVICE

(71) Applicant: TOSHIBA MEMORY CORPORATION, Minato-ku, Tokyo (JP)

(72) Inventors: Fumiyoshi Matsuoka, Kawasaki Kanagawa (JP); Kosuke Hatsuda, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/917,377

(22) Filed: Mar. 9, 2018

(65) Prior Publication Data

US 2019/0088303 A1   Mar. 21, 2019

(30) Foreign Application Priority Data

Sep. 20, 2017   (JP) .................. 2017-179928

(51) Int. Cl.
| | | |
|---|---|---|
| G11C 7/00 | (2006.01) | |
| G11C 11/16 | (2006.01) | |
| H01L 27/22 | (2006.01) | |
| H01F 10/32 | (2006.01) | |
| H01L 43/08 | (2006.01) | |
| H01L 43/10 | (2006.01) | |

(52) U.S. Cl.
CPC ........ G11C 11/1675 (2013.01); G11C 11/161 (2013.01); G11C 11/1655 (2013.01); G11C 11/1657 (2013.01); G11C 11/1673 (2013.01); *H01F 10/3254* (2013.01); *H01F 10/3286* (2013.01); *H01L 27/228* (2013.01); *H01L 43/08* (2013.01); *H01L 43/10* (2013.01)

(58) Field of Classification Search
CPC ....... G11C 7/1078; G11C 7/22; G11C 7/1006; G11C 7/1072; G11C 7/1096
USPC ........................ 365/189.16, 189.14
See application file for complete search history.

(56) References Cited

U.S. PATENT DOCUMENTS

| | | |
|---|---|---|
| 7,376,801 B2 | 5/2008 | Moriyama et al. |
| 2008/0151656 A1 | 6/2008 | Nakai |
| 2010/0103723 A1* | 4/2010 | Kawai ............... G11C 11/56 365/163 |
| 2014/0063896 A1* | 3/2014 | Ahn .................. G11C 13/0064 365/145 |

FOREIGN PATENT DOCUMENTS

| | | |
|---|---|---|
| JP | 06076586 A | 3/1994 |
| JP | 2003272389 A | 9/2003 |
| JP | 2008159178 A | 7/2008 |
| JP | 2010033620 A | 2/2010 |

\* cited by examiner

*Primary Examiner* — Son T Dinh
(74) *Attorney, Agent, or Firm* — Holtz, Holtz & Volek PC

(57) ABSTRACT

According to one embodiment, a semiconductor memory device comprises a first memory cell including a first resistance change element; and a write circuit configured to write data to the first memory cell. The write circuit includes a first circuit including a first input terminal supplied with a first signal based on read data from the first memory cell and a second input terminal supplied with a second signal based on write data to the first memory cell; and a second circuit including a first input terminal supplied with a third signal from an output terminal of the first circuit and a second input terminal supplied with a fourth signal.

17 Claims, 15 Drawing Sheets

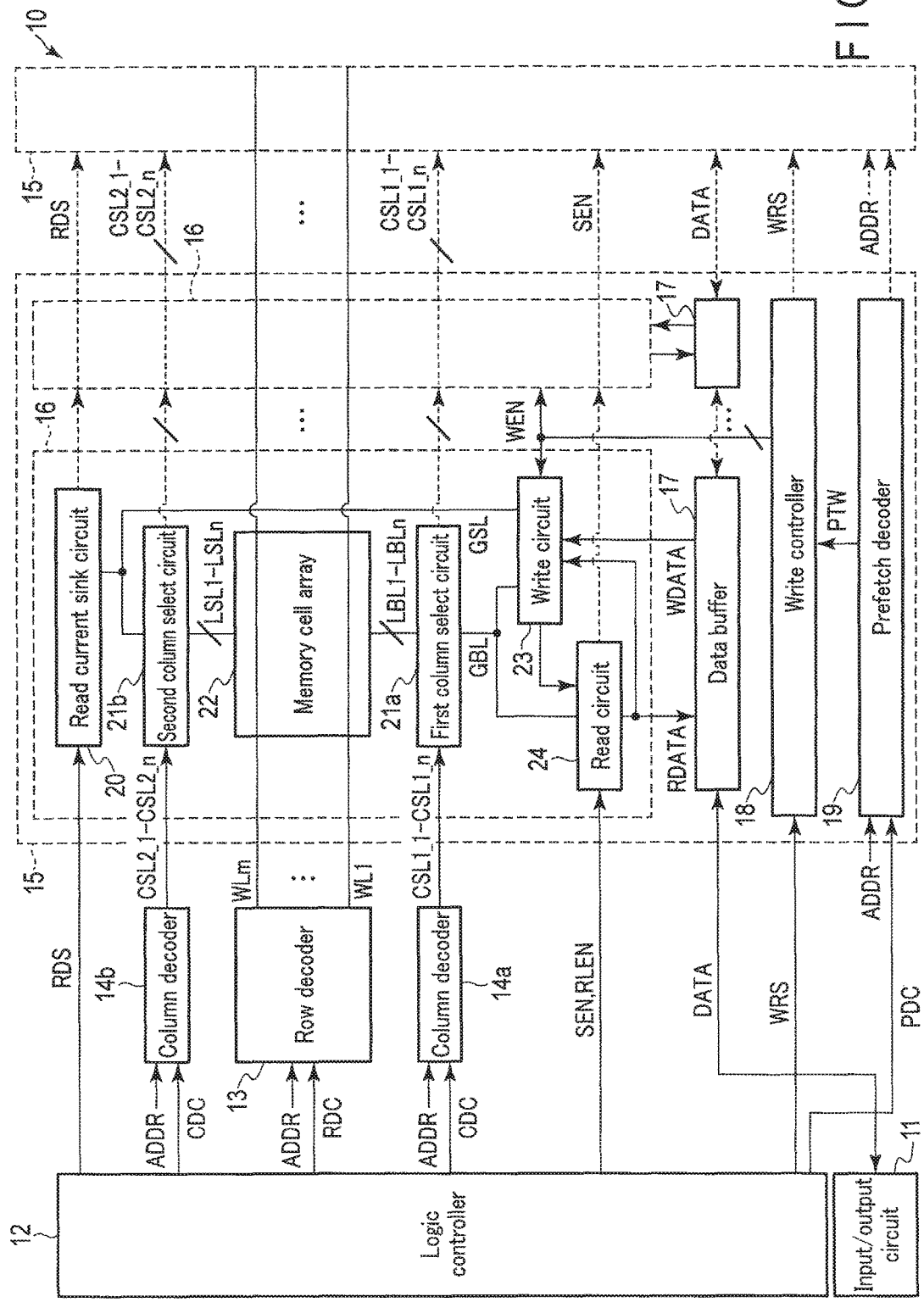
F I G. 1

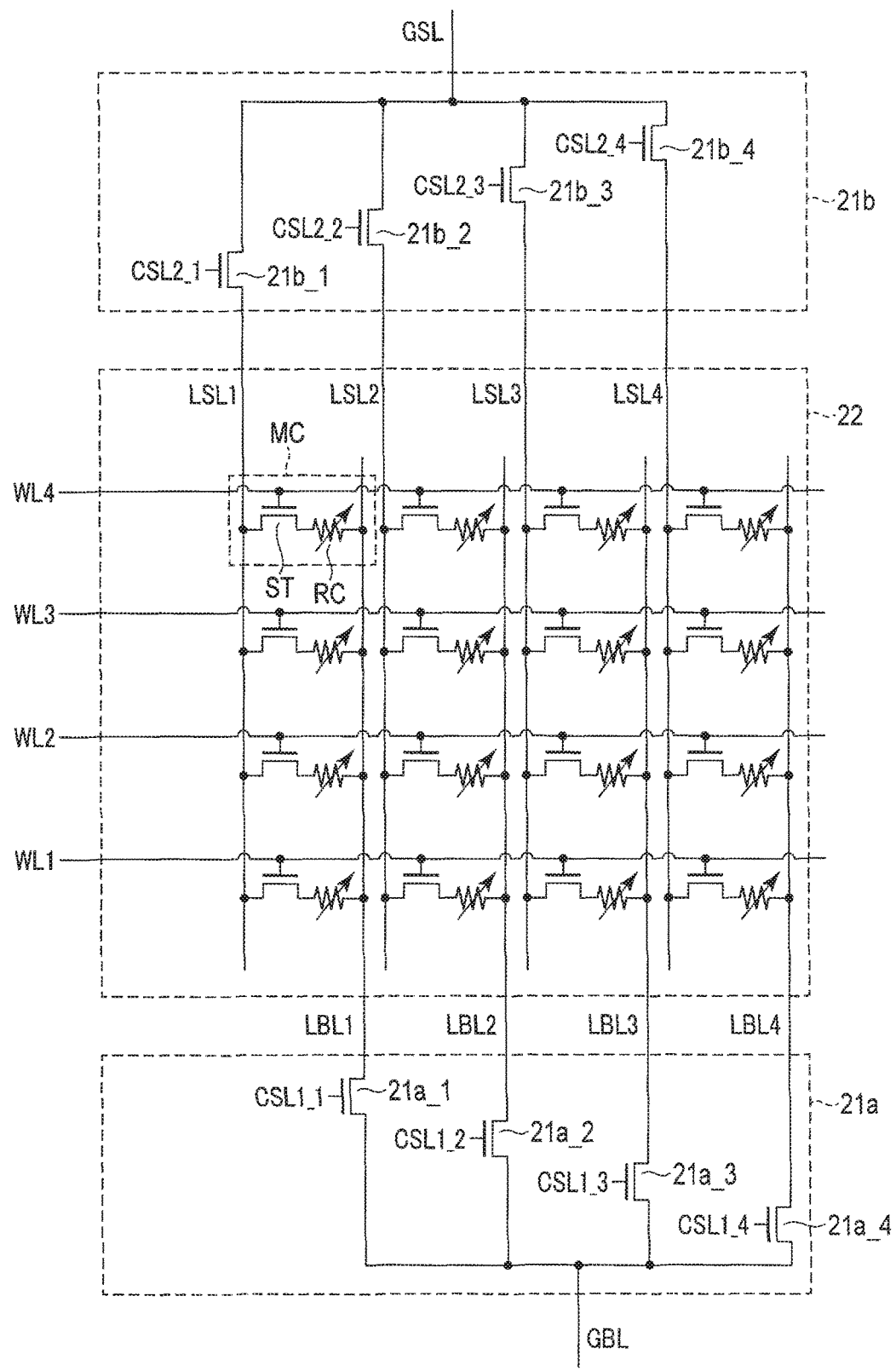
F I G. 2

Parallel state (low resistance)

Antiparallel state (high resistance)

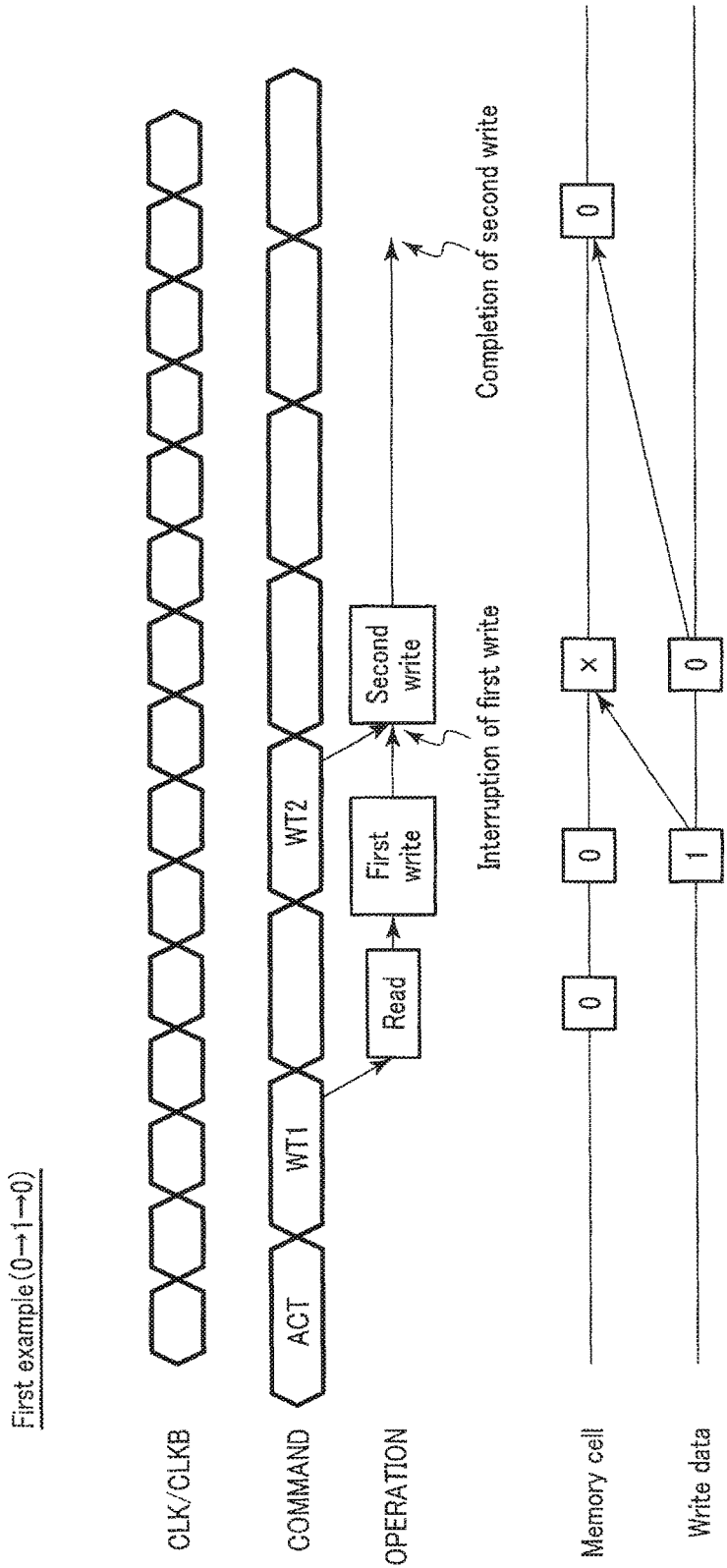
F I G. 5

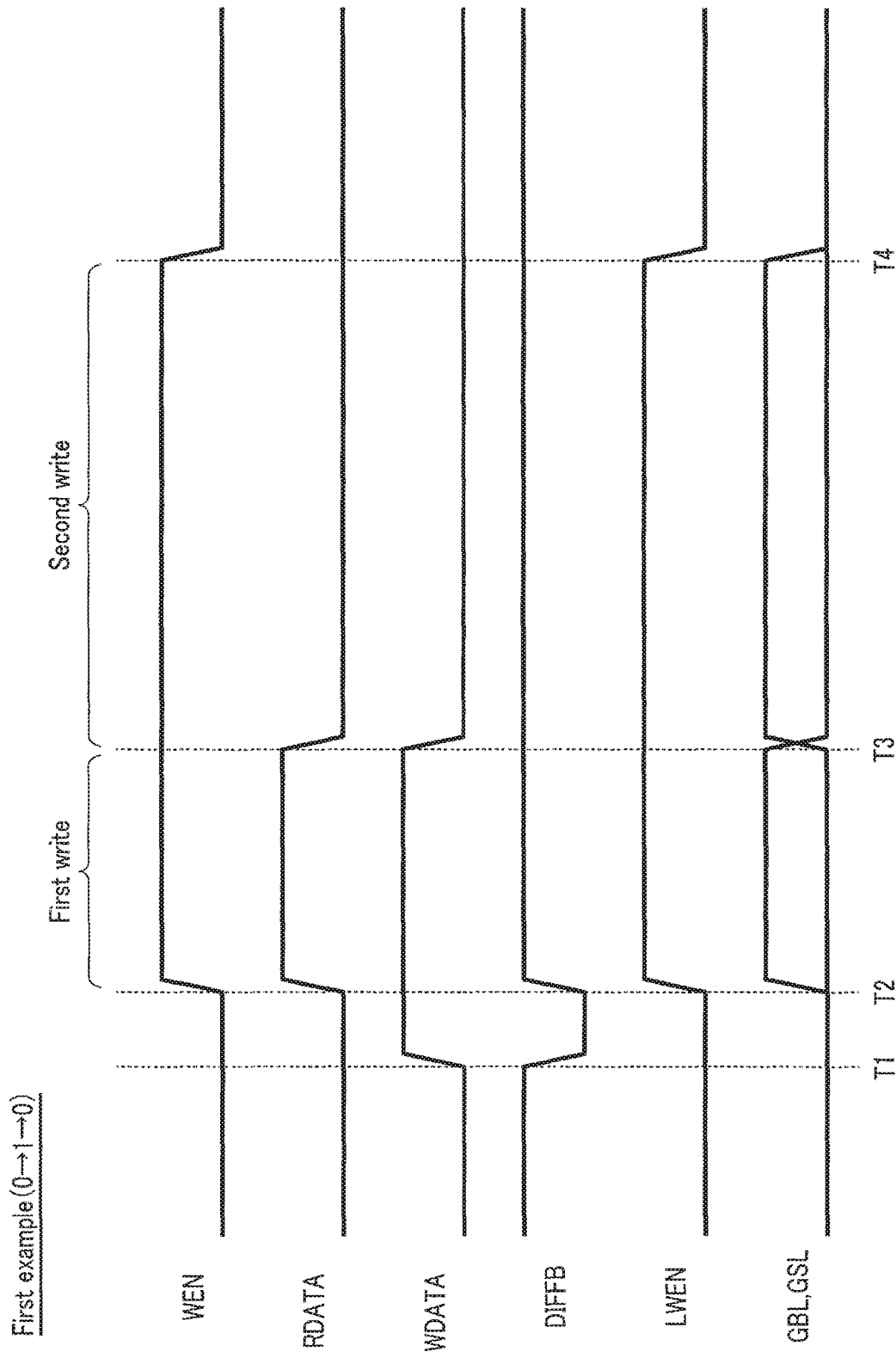
F I G. 6

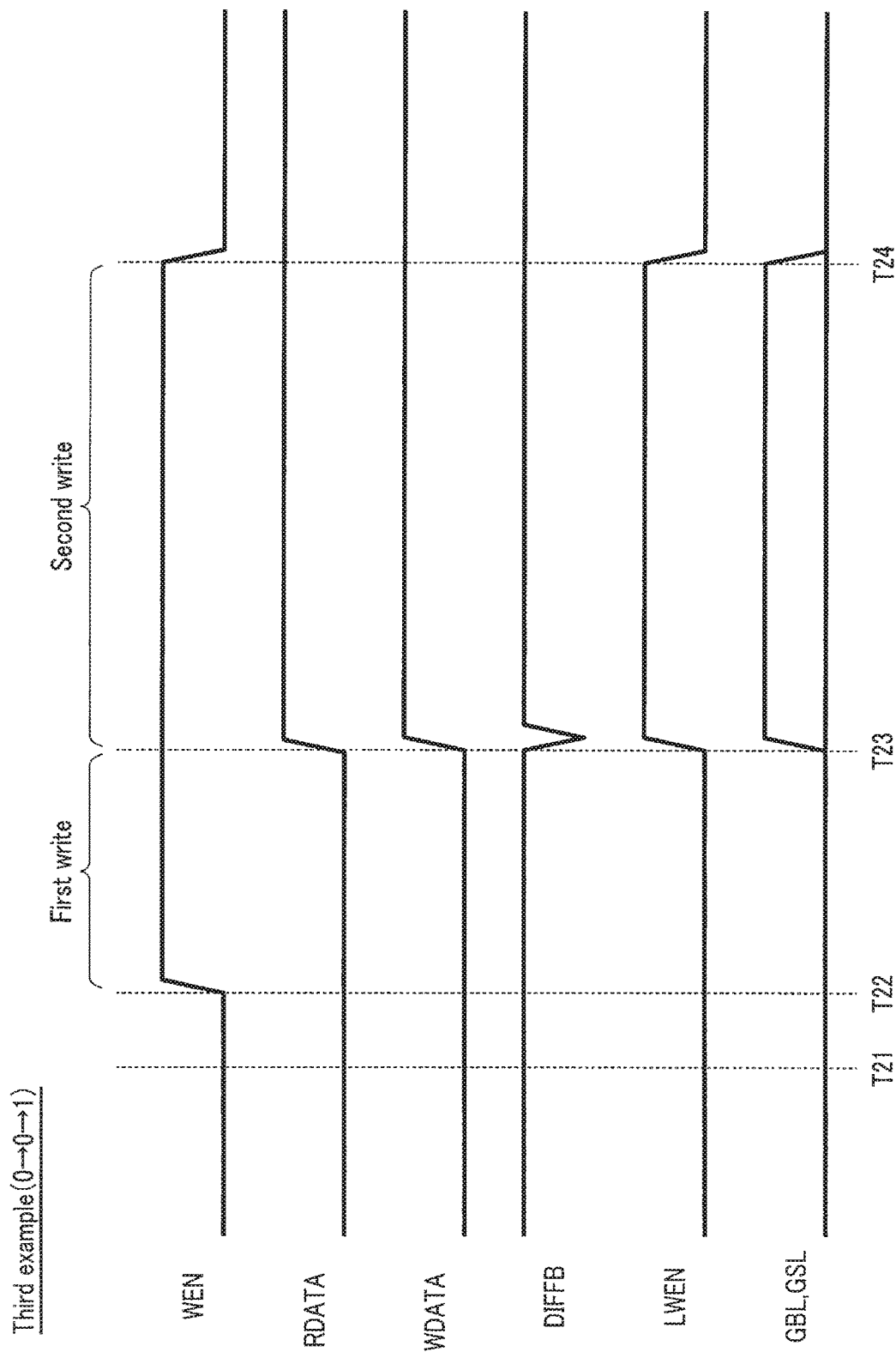
F I G. 10

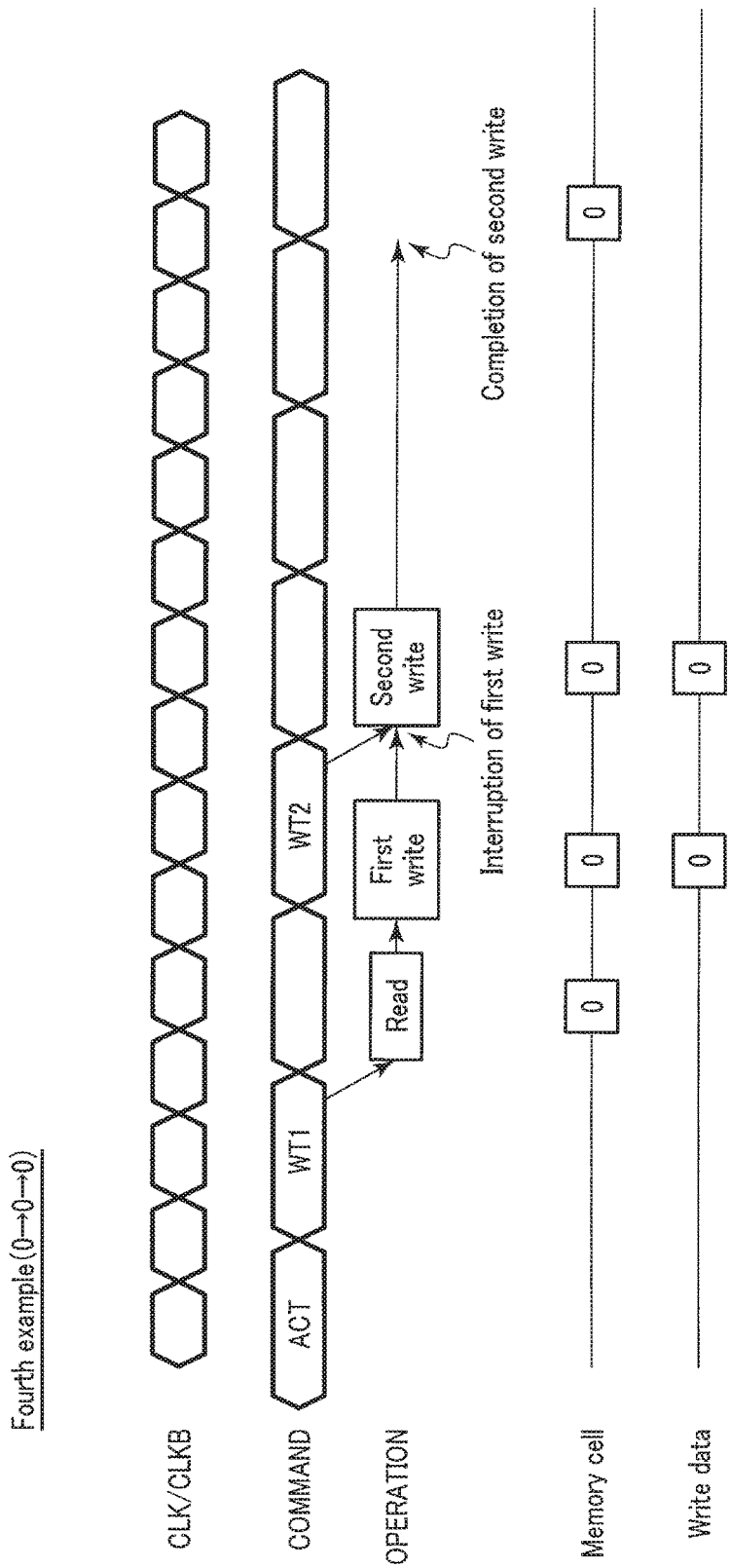
F I G. 11

SEMICONDUCTOR MEMORY DEVICE

CROSS-REFERENCE TO RELATED APPLICATION

This application is based upon and claims the benefit of priority from prior Japanese Patent Application No. 2017-179928, filed Sep. 20, 2017, the entire contents of which are incorporated herein by reference

FIELD

Embodiments described herein relate generally to a semiconductor memory device.

BACKGROUND

Magnetic random access memory (MRAM) is a memory device in which memory elements having a magnetoresistance effect are used in memory cells that store information. The MRAM is attracting attention as a next-generation memory device having features of high-speed operation, large capacity and nonvolatility.

BRIEF DESCRIPTION OF THE DRAWINGS

FIG. 1 is a block diagram showing a semiconductor memory device according to an embodiment;

FIG. 2 is a detailed circuit diagram of a memory cell array, a first column select circuit and a second column select circuit in the semiconductor memory device according to the embodiment;

FIG. 5 is a chart showing a command sequence in a first example of write operation in the semiconductor memory device according to the embodiment;

FIG. 6 is a timing chart of various signals of the first example of write operation in the semiconductor memory device according to the embodiment;

FIG. 10 is a timing chart of various signals of the third example of write operation in the semiconductor memory device according to the embodiment;

FIG. 11 is a chart showing a command sequence in a fourth example of write operation in the semiconductor memory device according to the embodiment;

DETAILED DESCRIPTION

Figure 3A:
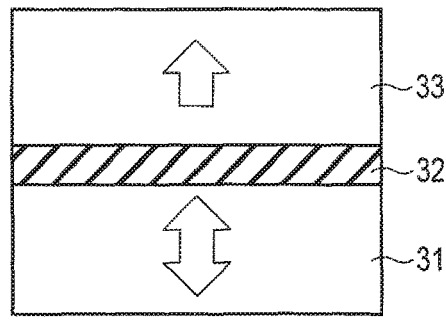
FIG. 3A is a cross-sectional view showing a resistance change element in the semiconductor memory device according to the embodiment.

In general, according to one embodiment, a semiconductor memory device includes a first memory cell including a first resistance change element; and a write circuit configured to perform write to the first memory cell. The write circuit includes a first circuit including a first input terminal supplied with a first signal based on read data from the first memory cell and a second input terminal supplied with a second signal based on write data to the first memory cell; and a second circuit including a first input terminal supplied with a third signal from an output terminal of the first circuit and a second input terminal supplied with a fourth signal.

The embodiment will be described below with reference to the accompanying drawings. Like reference symbols designate similar or corresponding components throughout the drawings.

Embodiment

A semiconductor memory device according to the embodiment will be described below with reference to FIGS. 1-5. The semiconductor memory device will be exemplified below by an MRAM that stores data using a magnetic tunnel junction (MTJ) element as a resistance change element. In the present embodiment, the semiconductor memory device is not limited to the MRAM but can be applied to memories that sense a resistance difference of a resistance change element by converting the resistance difference into a current difference or a voltage difference.

In the following description, the term "couple" means coupling via an arbitrary element as well as coupling directly unless it is limited in particular. The first terminal of a transistor may indicate one of a source and a drain and the second terminal thereof may indicate the other. The control terminal of the transistor may indicate a gate.

Configuration Example of Embodiment

FIG. 1 shows a semiconductor memory device (MRAM) 10 according to the embodiment.

As shown in FIG. 1, the semiconductor memory device 10 includes an input/output circuit 11, a logic controller 12, a row decoder 13, column decoders 14a and 14b and a plurality of core blocks 15. In FIG. 1, one core block 15 is specifically shown and the other core blocks 15 have the same configuration. The number of core blocks 15 is optional. For brevity, FIG. 1 shows some of signal lines electrically coupling the blocks.

The logic controller 12 controls the entire semiconductor memory device 10 in response to external input signals (e.g. various kinds of commands). For example, the logic controller 12 transmits control signals to the row decoder 13, column decoders 14a and 14b, core blocks 15, etc. and controls them, respectively.

More specifically, the logic controller 12 transmits a row decoder control signal RDC to the row decoder 13 and transmits a column decoder control signal CDC to the column decoders 14a and 14b. The logic controller 12 also transmits a write start signal WRS to a write controller 18 of each of the core blocks 15 and transmits a prefetch decoder control signal PDC to a prefetch decoder 19. The logic controller 12 also transmits a read sink signal RDS to a read current sink circuit 20 in each memory unit 16 of each of the core blocks 15 and transmit a sense amplifier enable signal SEN and a signal RLEN to a read circuit 24 in each memory unit 16.

The input/output circuit 11 receives write data from outside and transmits data DATA to a data buffer of each of the core blocks 15 based on the write data. The input/output circuit 11 also receives data DATA from the data buffer 17 and outputs read data to the outside.

The row decoder 13 decodes an address signal ADDR from an external device, based on the row decoder control signal RDC from the logic controller 12. In accordance with a result of the decoding, the row decoder 13 selects a corresponding one of word lines WL1 to WLm (m is an integer of two or more). Hereinafter, the word lines WL1 to WLm will be simplified as "word line WL" unless any one of the word lines WL1 to WLm is particularly chosen. The word line WL is electrically coupled to a memory cell array 22 of each of the core blocks 15.

The column decoder 14a decodes the address signal ADDR, based on the column decoder control signal CDC from the logic controller 12. In accordance with a result of the decoding, the column decoder 14a selects a corresponding one of first column signals CSL1_1 to CSL1_n (n is an integer of two or more). Hereinafter, the first column signals CSL1_1 to CSL1_n will be simplified as "first column signal CSL1" unless any one of the first column signals CSL1_1 to CSL1_n is particularly chosen. The first column signal CSL1 is transmitted to a first column select circuit 21a of each of the core blocks 15.

Like the column decoder 14a, the column decoder 14b decodes the address signal ADDR, based on the column decoder control signal CDC from the logic controller 12. In accordance with a result of the decoding, the column decoder 14b selects a corresponding one of second column signals CSL2_1 to CSL2_n. Hereinafter, the second column signals CSL2_1 to CSL2_n will be simplified as "second column signal CSL2" unless any one of the second column signals CSL2_1 to CSL2_n is particularly chosen. The first column signals CSL1_1 to CSL1_n correspond to the second column signals CSL2_1 to CSL2_n, respectively. The second column signal CSL2 is transmitted to a second column select circuit 21b of each of the core blocks 15.

Each of the core blocks 15 includes a plurality of memory units 16, a plurality of data buffers 17, a write controller 18 and a prefetch decoder 19. In FIG. 1, one memory unit 16 is specifically shown and the other memory units 16 have the same configuration.

Below is a description of a case where each core block 15 is provided with the memory units 16 the number of which corresponds to the unit of data transferred continuously in response to one address signal ADDR (one command) (referred to as "prefetch unit" hereinafter). For example, if the data length (burst length) of data transferred continuously in response to one address signal ADDR is 4 bits and the number of data lines IO for inputting and outputting data to and from an external device is 16, the prefetch unit is 4×16=64 bits. Thus, each core block 15 includes 64 memory units 16. Note that the number of memory unit 16 is optional. Data buffers 17 correspond to memory units 16 and for example, the number of data buffers 17 is equal to that of memory units 16.

The memory units 16 are provided to correspond to writing and reading of one-bit data. Each of the memory units 16 includes a read current sink circuit 20, a first column select circuit 21a, a second column select circuit 21b, a memory cell array 22, a write circuit 23 and a read circuit 24.

The memory cell array 22 includes a plurality of memory cells arranged two-dimensionally in matrix. Each of the memory cells stores data nonvolatilely. The memory cell array 22 is electrically coupled to the row decoder 13 via the word lines WL1 to WLm. The memory cell array 22 is also electrically coupled to the first column select circuit 21a via the local bit lines LBL1 to LBLn. The memory cell array 22 is also electrically coupled to the second column select circuit 21b via the local source lines LSL1 to LSLn. Hereinafter, the local bit lines LBL1 to LBLn will be simplified as "local bit line LBL" unless any one of the local bit lines LBL1 to LBLn is particularly chosen. Similarly, the local source lines LSL1 to LSLn will be simplified as "local source line LSL" unless any one of the local source lines LSL1 to LSLn is particularly chosen.

The first column select circuit 21a selects one of local bit lines LBL in response to the first column signal CSL1 from the column decoder 14a. The first column select circuit 21a electrically couples the selected local bit line LBL to a global bit line GBL.

The second column select circuit 21b selects one of local source lines LSL in response to the second column signal CSL2 from the column decoder 14b. The second column select circuit 21b electrically couples the selected local source line LSL to a global source line GSL.

FIG. 2 shows the memory cell array 22, first column select circuit 21a and second column select circuit 21b in the semiconductor memory device 10 according to the embodiment. In FIG. 2, for example, word lines WL1 to WL4, local bit lines LBL1 to LBL4 and local source lines LSL1 to LSL4 are provided (m, n=4).

As shown in FIG. 2, the memory cell array 22 is provided with the local bit lines LBL (LBL1 to LBL4), the local source lines LSL (LSL1 to LSL4) and the word lines WL (WL1 to WL4). The local bit lines LBL and the local source lines LSL extend in a first direction. The local bit lines LBL and the local source lines LSL are arranged alternately in a second direction intersecting the first direction. The word lines WL extend in the second direction. The memory cell array 22 includes a plurality of memory cells MC. The memory cells MC are provided at their respective points at which the local bit lines LBL and the local source lines LSL intersect the word lines WL. The memory cells MC are therefore arranged in matrix in the first and second directions.

The memory cells MC each include a resistance change element RC, a select transistor ST and the like. The first terminal of the resistance change element RC is electrically coupled to the local bit line LBL, and the second terminal thereof is electrically coupled to the first terminal of the select transistor ST. The second terminal of the select transistor ST is electrically coupled to the local source line LSL, and the control terminal thereof is electrically coupled to the word line WL.

The resistance change element RC is an element whose resistance value is changed by applying a current (or a voltage) thereto. The resistance change element RC includes an MTJ element, a phase change element and the like. Each memory cell MC is selected when the select transistor ST is turned on by the word line WL. Assume here that the MRAM, or the resistance change element RC is an MTJ element.

FIG. 3A is a cross-sectional view showing a resistance change element RC in the semiconductor memory device 10 according to the embodiment. In FIG. 3A, a storage layer 31, a tunnel barrier layer 32 and a reference layer 33 are shown chiefly as the resistance change element RC.

As shown in FIG. 3A, the resistance change element RC includes a laminate composed of a storage layer 31 that is ferromagnetic layer, a reference layer 33 that is a ferromagnetic layer and a tunnel barrier layer 32 that is a nonmagnetic layer interposed therebetween.

The storage layer 31 is a ferromagnetic layer whose magnetization direction is variable and has perpendicular magnetic anisotropy in which it is perpendicular or almost perpendicular to the film surface (top surface/undersurface). The variable magnetization direction means that the magnetization direction varies with a given write current. The "almost perpendicular" means that the direction of remanent magnetization falls within a range of $4.5°<\theta≤90°$ with respect to the film surface. The storage layer 31 is composed of cobalt iron boron (CoFeB), iron boride (FeB) or the like.

The tunnel barrier layer 32 is formed on the storage layer 31. The tunnel barrier layer 32 is a nonmagnetic layer and is composed of, MgO.

The reference layer 33 is formed on the tunnel barrier layer 32. The reference layer 33 is a ferromagnetic layer whose magnetization direction is invariable and has perpendicular magnetic anisotropy in which it is perpendicular or almost perpendicular to the film surface. The invariable magnetization direction means that the magnetization direction does not vary with a given write current. In other words, the reference layer 33 has a magnetization-direction reverse energy barrier that is larger than that of the storage layer 31. The reference layer 33 is composed of cobalt platinum (CoPt), cobalt nickel (CoNi), cobalt palladium (CoPd) or the like.

Figure 3B:
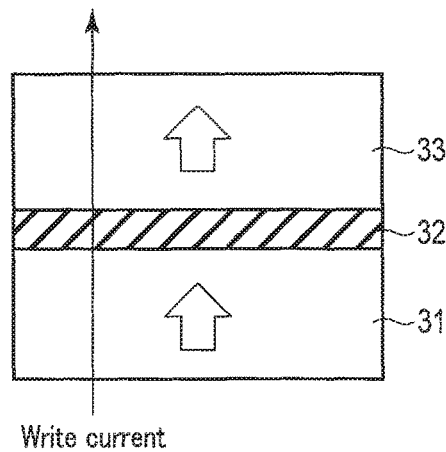
FIG. 3B is a cross-sectional view of the resistance change element in the semiconductor memory device according to the embodiment, which is in parallel (P) state, illustrating writing of the resistance change element.
Figure 3C:
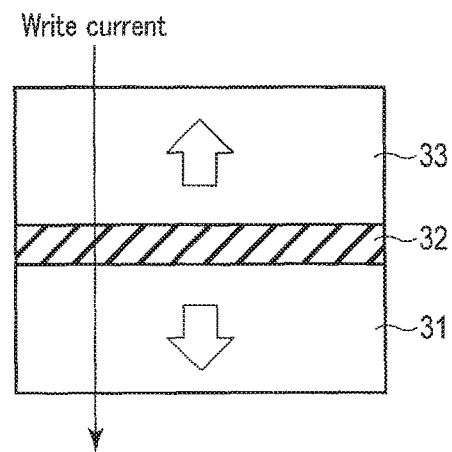
FIG. 3C is a cross-sectional view of the resistance change element in the semiconductor memory device according to the embodiment, which is in antiparallel (AP) state, illustrating writing of the resistance change element.

FIG. 3B is a cross-sectional view of the resistance change element RC in the semiconductor memory device 10 according to the embodiment, which is in parallel (P) state, illustrating writing of the resistance change element RC. FIG. 3C is a cross-sectional view of the resistance change element RC in the semiconductor memory device 10 according to the embodiment, which is in antiparallel (AP) state, illustrating writing of the resistance change element RC.

The resistance change element RC is, for example, a spin injection type resistance change element. Therefore, when data is written to the resistance change element RC or data is read from the resistance change element RC, current flows through the resistance change element RC bidirectionally in the direction perpendicular to the film surface.

More specifically, data is written to the resistance change element RC as will be described below.

As illustrated in FIG. 3B, when current flows from the storage layer 31 to the reference layer 33, or when electrons are supplied from the reference layer 33 to the storage layer 31, the electrons are spin-polarized in the same direction as the magnetization direction of the reference layer 33 and injected into the storage layer 31. In this case, the magnetization direction of the storage layer 31 is made equal to that of the reference layer 33. Accordingly, the reference layer 33 and the storage layer 31 are arranged in parallel. In this parallel state, the resistance of the resistance change element RC becomes the lowest. This case will be defined as "0" data, for example.

As illustrated in FIG. 3C, when current flows from the reference layer 33 to the storage layer 31, or when electrons are supplied from the storage layer 31 to the reference layer 33, the electrons are reflected by the reference layer 33, spin-polarized in a direction opposite to the magnetization direction of the reference layer 33 and injected into the storage layer 31. In this case, the magnetization direction of the storage layer 31 is made opposite to that of the reference layer 33. Accordingly, the reference layer 33 and the storage layer 31 are arranged in antiparallel. In this antiparallel state, the resistance of the resistance change element RC becomes the highest. This case will be defined as "1" data, for example.

Furthermore, data is read from the resistance change element RC as will be described below.

The resistance change element RC is supplied with read current. The read current is set at a value in which the magnetization direction of the storage layer 33 is not reversed (a value that is smaller than the write current value). The "0" data and "1" data can be read by detecting the difference between read currents in the parallel and anti-parallel states.

As illustrated in FIG. 2 again, the first column select circuit 21a includes first column select transistors 21a_1 to 21a_4. The first terminals of the first column select transistors 21a_1 to 21a_4 are electrically coupled to their respective local bit lines LBL1 to LBL4. The second terminals of the first column select transistors 21a_1 to 21a_4 are electrically coupled in common to the global bit line GBL. The control terminals of the first column select transistors 21a_1 to 21a_4 are supplied with their respective first column signals CSL1_1 to CSL1_4.

The second column select circuit 21b includes second column select transistors 21b_1 to 21b_4. The first terminals of the second column select transistors 21b_1 to 21b_4 are electrically coupled to their respective local source lines LSL1 to LSL4. The second terminals of the second column select transistors 21b_1 to 21b_4 are electrically coupled in common to the global source line GSL. The control terminals of the second column select transistors 21b_1 to 21b_4 are supplied with their respective second column signals CSL2_1 to CSL2_4.

The first column signals CSL1_1 to CSL1_4 and the second column signals CSL2_1 to CSL2_4 correspond to one another and perform the same operation. More specifically, the first column select transistor 21a_1 and the second column select transistor 21b_1 are turned on or off simultaneously, the first column select transistor 21a_2 and the second column select transistor 21b_2 are turned on or off simultaneously, the first column select transistor 21a_3 and the second column select transistor 21b_3 are turned on or simultaneously and the first column select transistor 21a_4 and the second column select transistor 21b_4 are turned on or off simultaneously.

As illustrated in FIG. 1 again, the write circuit 23 writes write data WDATA from the data buffer 17 to the memory cell array 22 in response to a write enable signal WEN from the write controller 18. More specifically, the write circuit 23 applies a write voltage (e.g. a power supply voltage VDD) to one of the global bit line GBL and global source line GSL from an external power supply or a voltage generation circuit, and applies a ground voltage VSS to the other thereof. The write enable signal WEN is a signal based on a write start signal WRS from the write controller 18. The write start signal WRS is a signal based on a write command. In other words, the write enable signal WEN is a signal based on a write command. The write voltage is a voltage that is applied to a write current path including a memory cell MC when data is written. When data is written, a write voltage is applied between the global bit line GBL and the global source line GSL, and write current flows through a memory cell MC that is electrically coupled to the global bit line GBL and the global source line GSL.

When data is read, read current flows into the read current sink circuit 20 from the global source line GSL based on a signal RDS from the logic controller 12. The read current is current that flows through a memory cell MC by applying a read voltage to the memory cell MC when data is read. In other words, the read current sink circuit 20 is electrically coupled to a ground voltage line to ground the global source line GSL.

The read circuit 24 reads data from the memory cell array 22 in response to a mouse amplifier enable signal SEN from the logic controller 12. The read circuit 24 transmits the read data RDATA to the data buffer 17.

The data buffer 17 is provided to correspond to a memory unit 16. The data buffer 17 holds one-bit data, and transmits and receives the data to and from the corresponding memory unit 16. More specifically, when data is written, the data buffer 17 holds one-bit data DATA supplied from an external device, and transmits write data WDATA to the write circuit 23 of the corresponding memory unit 16. When data is read, the data buffer 17 holds one-bit read data RDATA read by the read circuit 24, and transmits data DATA to an external device.

The write controller 18 transmits a write enable signal WEN to the write circuit 23 of each memory unit 16 based on a write start signal WRS from the logic controller 12 and a signal PTW from the prefetch decoder 19. The write start signal WRS is a signal based on the reception of a write command.

The prefetch decoder 19 decodes an address signal ADDR based on a prefetch decoder control signal PDC from the logic controller 12. In accordance with a result of the decoding, the prefetch decoder 19 selects a corresponding core block 15.

Figure 4:
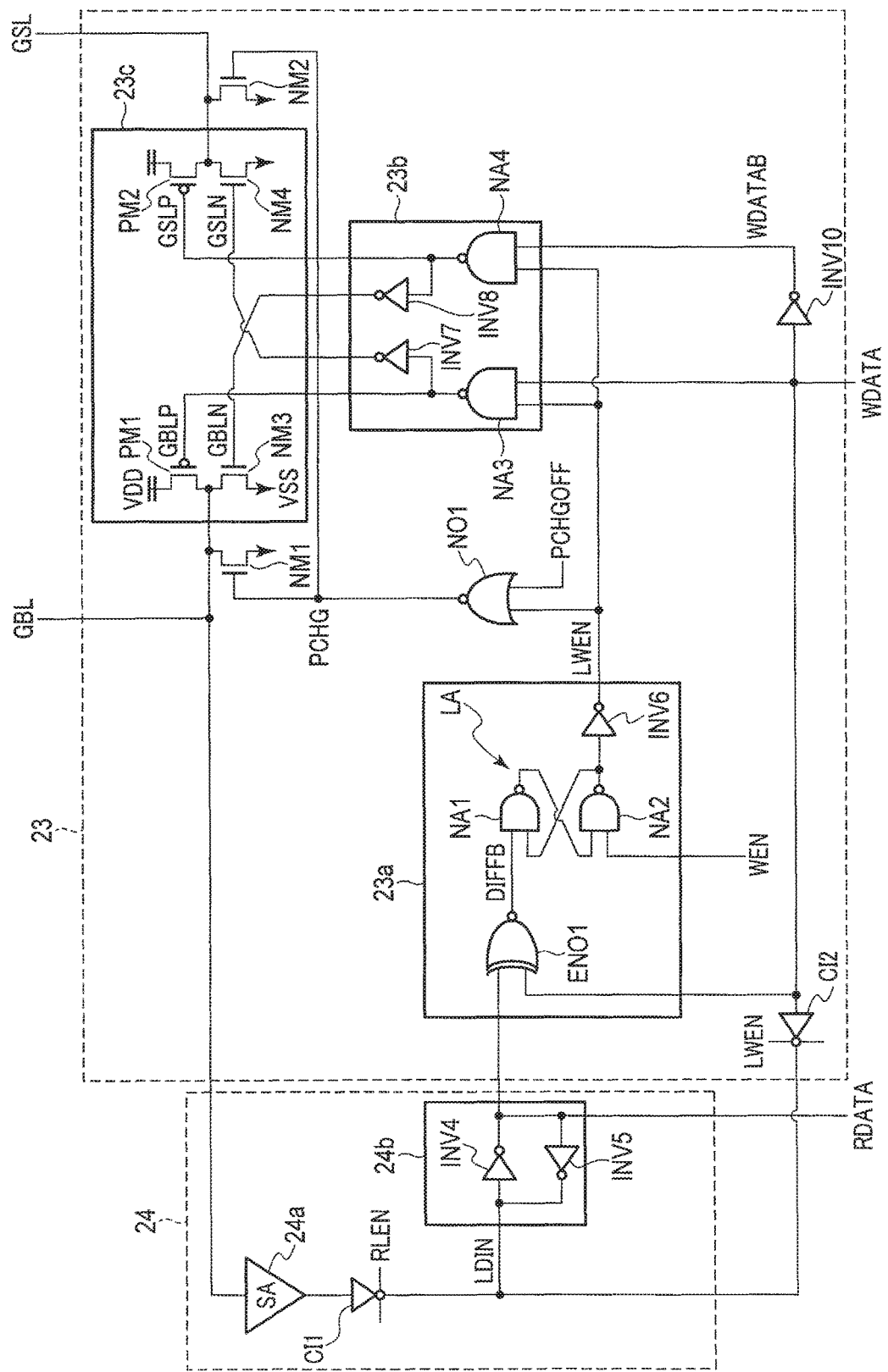
FIG. 4 is a circuit diagram showing a write circuit and a read circuit in the semiconductor memory device according to the embodiment.

FIG. 4 is a circuit diagram showing the write circuit 23 and the read circuit 24 in the semiconductor memory device 10 according to the embodiment.

As shown in FIG. 4, the read circuit 24 includes a sense amplifier 24a, a data latch 24b and a clocked inverter CI1.

The input terminal of the sense amplifier 24a is electrically coupled to the global bit line GBL, and the sense amplifier 24a reads data from a memory cell MC. The output terminal of the sense amplifier 24a is electrically coupled to the input terminal of the clocked inverter CI1.

The input terminal of the clocked inverter CI1 is electrically coupled to the output terminal of the sense amplifier 24a. The output terminal of the clocked inverter CI1 outputs inverted logic of read data from the sense amplifier 24a as a signal LDIN. The control terminal of the clocked inverter CI1 is supplied with a signal RLEN. When the signal RLEN is at an "H" level, the clocked inverter CI1 outputs inverted logic of read data from the sense amplifier 24a as a signal LDIN. When the signal RLEN is at an "L" level, the output (signal LDIN) of the clocked inverter CI1 is brought into a high-impedance state.

The input terminal of the data latch 24b is supplied with the signal LDIN from the clocked inverter CI1. The data latch 24b holds the read data from the clocked inverter CI1. The data latch 24b is composed of inverters INV4 and INV5 whose input and output terminals are electrically coupled to each other. Specifically, the output terminal of the inverter INV4 is electrically coupled to the input terminal of the inverter INV5, and the output terminal of the inverter INV5 is electrically coupled to the input terminal of the inverter INV4. The input terminal of the inverter INV4 is the input terminal of the data latch 24b and is supplied with the signal LDIN. The output terminal of the inverter INV4 is the output terminal of the sense amplifier 24b and outputs the signal RDATA.

The write circuit 23 includes a data comparison circuit 23a, a predriver 23b, a write driver 23c, a clocked inverter CI2, an inverter INV10, a NOR circuit NO1 and NMOS transistors NM1 and NM2.

The input terminal of the clocked inverter CI2 is supplied with a write data signal WDATA. The output terminal of the clocked inverter CI2 outputs inverted logic of the signal WDATA as a signal LDIN. The data latch 24b holds write data from the clocked inverter CI2. The control terminal of the clocked inverter CI2 is supplied with a signal LWEN. When the signal LWEN is at an "H" level, the clocked inverter CI2 outputs inverted logic of the write data WDATA as a signal LDIN. When the signal LWEN is at an "L" level, the output (signal LDIN) of the clocked inverter CI2 is brought into a high-impedance state.

The data comparison circuit 23a includes an exclusive NOR circuit ENO1, a latch circuit LA and an inverter INV6.

The first input terminal of the exclusive NOR circuit ENO1 is supplied with the output signal RDATA of the latch circuit 24b. The second input terminal of the exclusive NOR circuit ENO1 is supplied with the signal WDATA. In other words, the exclusive NOR circuit ENO1 compares a signal based on the read data and a signal based on the write data. The output terminal of the exclusive NOR circuit ENO1 outputs a signal DIFFB to the latch circuit LA as a result of the comparison.

The latch circuit LA is composed of NAND circuits NA1 and NA2 and holds the comparison result of the exclusive NOR circuit ENO1. The first input terminal of the NAND circuit NA1 is the first input terminal of the latch circuit LA and is supplied with the signal DIFFB. The second input terminal of the NAND circuit NA1 is electrically coupled to the output terminal of the NAND circuit NA2. The output terminal of the NAND circuit NA1 is electrically coupled to the first input terminal of the NAND circuit NA2. The second input terminal of the NAND circuit NA2 is the second input terminal the latch circuit LA, and the NAND circuit NA2 is supplied with the signal WEN. The output terminal of the NAND circuit NA2 is the output terminal of the latch circuit LA and is electrically coupled to the input terminal of the inverter INV6.

The latch circuit LA is supplied with the signal DIFFB as a set signal and is supplied with the signal WEN as a reset signal. For example, when the signal WEN is at an "L" level, the latch circuit LA is reset and outputs an "H" level signal irrespective of the signal DIFFB. When the signal WEN becomes an "H (high)" level, the reset of the latch circuit LA is released, and the latch circuit LA outputs a signal based on the signal DIFFB.

The output terminal of the inverter INV6 outputs the signal LWEN. If the signal LWEN is set at an "H" level (e.g. voltage VDD), the write driver 23c is driven to supply a power supply voltage VDD to one of the global bit line GBL and global source line GSL and supply a ground voltage VSS to the other.

The first input terminal of the NOR circuit NO1 is supplied with the signal LWEN and the second input terminal thereof is supplied with a signal PCHGOFF. The output terminal of the NOR circuit NO1 outputs a signal PCHG. The control terminals of the NMOS transistors NM1 and NM2 are supplied with the signal PCHG. The first terminal of the NMOS transistor NM1 is electrically coupled to the ground voltage line, and the second terminal thereof is electrically coupled to the global bit line GBL. The first terminal of the NMOS transistor NM2 is electrically coupled to the ground voltage line, and the second terminal thereof is electrically coupled to the global source line GSL.

The predriver 23b includes NAND circuits NA3 and NA4 and inverters INV7 and INV8.

The first input terminal of the NAND circuit NA3 is supplied with the signal LWEN and the second input terminal thereof is supplied with the signal WDATA. The output terminal of the NAND circuit NA3 outputs a signal GBLP. The input terminal of the inverter INV7 is supplied with the signal GBLP and the output terminal thereof outputs a signal GSLN.

The first input terminal of the NAND circuit NA4 is supplied with the signal LWEN and the second input terminal thereof is supplied with an inverted logic signal WDATAB of write data. The signal WDATAB is a signal obtained by inverting the signal WDATA by the inverter INV10. The output terminal of the NAND circuit NA4 outputs a signal GSLP. The input terminal of the inverter INV8 is supplied with the signal GSLP and the output terminal thereof outputs a signal GBLN.

The write driver 23c includes NMOS transistors and NM4 and PMOS transistors PM1 and PM2.

The control terminal of the NMOS transistor NM3 is supplied with the signal GBLN. The first terminal of the NMOS transistor NM3 is electrically coupled to the ground voltage line and the second terminal thereof is electrically coupled to the global bit line GBL. The control terminal of the PMOS transistor PM1 is supplied with the signal GBLP. The first terminal of the PMOS transistor PM1 is electrically coupled to the power supply voltage line and the second terminal thereof is electrically coupled to the global bit line GBL.

The control terminal of the NMOS transistor NM4 is supplied with the signal GSLN. The first terminal of the NMOS transistor NM4 is electrically coupled to the ground voltage line and the second terminal thereof is electrically coupled to the global source line GSL. The control terminal of the PMOS transistor PM2 is supplied with the signal GSLP. The first terminal the PMOS transistor PM2 is electrically coupled to the power supply voltage line and the second terminal thereof is electrically coupled to the global source line GSL.

Write Operation of Embodiment

A write operation of the semiconductor memory device according to the embodiment will be described below.

On the premise of write operation in this embodiment, data read from a memory cell MC and data written from outside are compared, and only when these data are different, write data is written to the memory cell MC. In this write operation, there is a case where before first write is completed by a write command, second write is performed by the next write command and thus the first write is interrupted.

In the above case, when the initial data (read data) of a memory cell MC and first write data (data written by first write) or second write data (data written by second write) are different (first to third examples described below), the write driver 23c is driven by the subsequent write (first write or second write) to perform write to the memory cell MC. When the initial data is the same as the first write data and the second write data, the write driver 23c is not driven in the first write or the second write, and no write to the memory cell MC is performed. These write operations will be described in detail below.

FIG. 5 is a chart showing a command sequence in a first example of write operation in the semiconductor memory device 10 according to the embodiment. In the first example, the initial data of a memory cell MC is "0," first write data is "1" and second write data is "0."

As shown in FIG. 5, the semiconductor memory device 10 operates upon receiving various commands based on timing of clock CLK/CLKB.

In the first example, the logic controller 12 first receives an active command ACT. Then, the logic controller 12 receives a write command WT1.

When the write command WT1 is received, the read circuit 24 reads data from the memory cell MC. For example, the read circuit 24 reads data "0" stored in the memory cell MC. Subsequently, the write circuit 23 starts the first write. The write data (first write data) is "1." Since the read data and the first write data are different, the write circuit 23 writes the first write data "1" to the memory cell MC.

Prior to the completion of the first write, the logic controller 12 receives a write command WT2. When the write command WT2 is received, the write circuit 23 interrupts the first write and starts the second write. The write data (second write data) is "0." Since the first write is interrupted while data different from the initial data is written to the memory cell MC, the data of the memory cell MC is unknown. Thus, the write circuit 23 writes the second write data "0" to the memory cell MC. Thereafter when the second write is completed, the second write data "0" is written to the memory cell MC.

The first example of the foregoing write operation will be described in detail with reference to FIGS. 4 and 6.

FIG. 6 is a timing chart of various signals of the first example of write operation in the semiconductor memory device 10 according to the embodiment.

In the first example, as shown in FIGS. 4 and 6, first, the signal RLEN (not shown in FIG. 6) temporarily becomes an "H (high)" level (e.g. voltage VDD) before time T1 and thus data "0" ("L (low)" level (e.g. voltage TSS)) is read from the sense amplifier 24a. Accordingly, the signal LDIN become an "H (high)" level. Assume here that the signal WDATA based on write data is at an "L" level as the initial state. Since, therefore, the exclusive NOR circuit ENO1 is supplied with an "L" level signal RDATA (inverted signal of signal LDIN) and an "L" level signal WDATA, it outputs an "H" level signal DIFFB. Since, furthermore, the signal WEN is at an "L" level, the latch circuit LA (NAND circuit NA2) outputs an "H" level signal irrespective of the level of the signal DIFFB, and the signal LWEN becomes an "L" level.

When the signal LWEN is at an "L" level, the NAND circuits NA3 and NA4 output an "H" level signal. In other words, the signals GBLP and GSLP become an "H" level and the signals GBLN and GSLN become an "L" level. Accordingly, the NMOS transistors NMS and NM4 and the PMOS transistors PM1 and PM2 are turned off. The signal PCHGOFF (not shown in FIG. 6) is at an "L" level, the output signal of the NOR circuit NO1 becomes an "H" level. Thus, the NMOS transistors NM1 and NM2 are turned on.

In other words, the write driver 23c is not driven, and the global bit line GBL and the global source line GSL both become an "L" level.

When data "1" ("H" level) is supplied as first write data at time T1, the signal WDATA becomes an "H" level. Accordingly, the exclusive NOR circuit ENO1 sets the signal DIFFB at an "L" level.

At time T2, the signal WEN becomes an "H" level. Accordingly, the reset of the latch circuit LA is released, and the latch circuit LA outputs an "L" level signal based on the signal DIFFB that is a set signal. In other words, the latch circuit LA outputs an "L" level signal while the signal WEN is maintained at an "H" level. Accordingly, the signal LWEN becomes an "H" level.

Since the signal WDATA is at an "H" level, the NAND circuit NA3 outputs an "L" level signal. In other words, the signal GBLP becomes an "L" level and the signal GSLN becomes an "H" level. Since the signal WDATAB is at an "L" level, the NAND circuit NA4 outputs an "H" level signal. In other words, the signal GSLP becomes an "H" level and the signal GBLN becomes an "L" level. Accordingly, the PMOS transistor PM1 and NMOS transistor NM4 are turned on and the PMOS transistor PM2 and the NMOS transistor NM3 are turned off. The output signal PCHG of the NOR circuit NO1 becomes an "L" level. Accordingly, the NMOS transistors NM1 and NM2 are turned off. Therefore, the write driver 23c is driven, the global source line GSL becomes an "H" level and the global bit line GBL becomes an "L" level. In other words, write current flows through a memory cell MC toward the global source line GSL from the global bit line GBL to start writing first write data "1."

The "H" level signal LWEN is supplied the clocked inverter CI2 and thus the signal LDIN becomes an "L" level. Since, therefore, the signal RDATA and signal WDATA both become an "H" level, the output signal DIFFB of the exclusive NOR circuit ENO1 becomes an "H" level.

When the first write is interrupted and data "0" ("L" level) is supplied as second write data at time T3, the signal WDATA becomes "L" level. Accordingly, the signal LDIN supplied through the clocked inverter CI2 becomes an "H" level, with the result that the exclusive NOR circuit ENO1 is supplied with the "L" level signal RDATA and the "L" level signal WDATA and thus the exclusive NOR circuit ENO1 maintains the "H" level of the signal DIFFB. Since, furthermore, the signal WEN remains at an "H" level, the latch circuit LA holds the "L" level signal irrespective of the signal DIFFB. The signal LWEN thus remains at an "H" level.

Since the signal WDATAB is at an "H" level, the NAND circuit NA4 outputs an "L" level signal. In other words, the signal GSLP becomes an "L" level and the signal GBLN becomes an "H" level. Since the signal WDATA is at an "L" level, the NAND circuit NA3 outputs an "H" level signal. In other words, the signal GBLP becomes an "H" level and the signal GSLN becomes an "L" level. Accordingly, the PMOS transistor PM2 and NMOS transistor NM3 are turned on and the PMOS transistor PM1 and the NMOS transistor NM4 are turned off. Therefore, the write driver 23c is driven, the global bit line GBL becomes an "L" level and the global source line GSL becomes an "H" level. In other words, write current flows through a memory cell MC toward the global bit line GBL from the global source line GSL to start writing second write data "0."

When the second write is completed at time T4, the signal WEN becomes an "L" level. Accordingly, the latch circuit LA is reset and outputs an "H" level signal. The signal LWEN thus becomes an "L" level. The write driver 23c is not driven, and the global bit line GBL and the global source line GSL both become an "L" level. The write operation in the first example is therefore completed.

Figure 7:
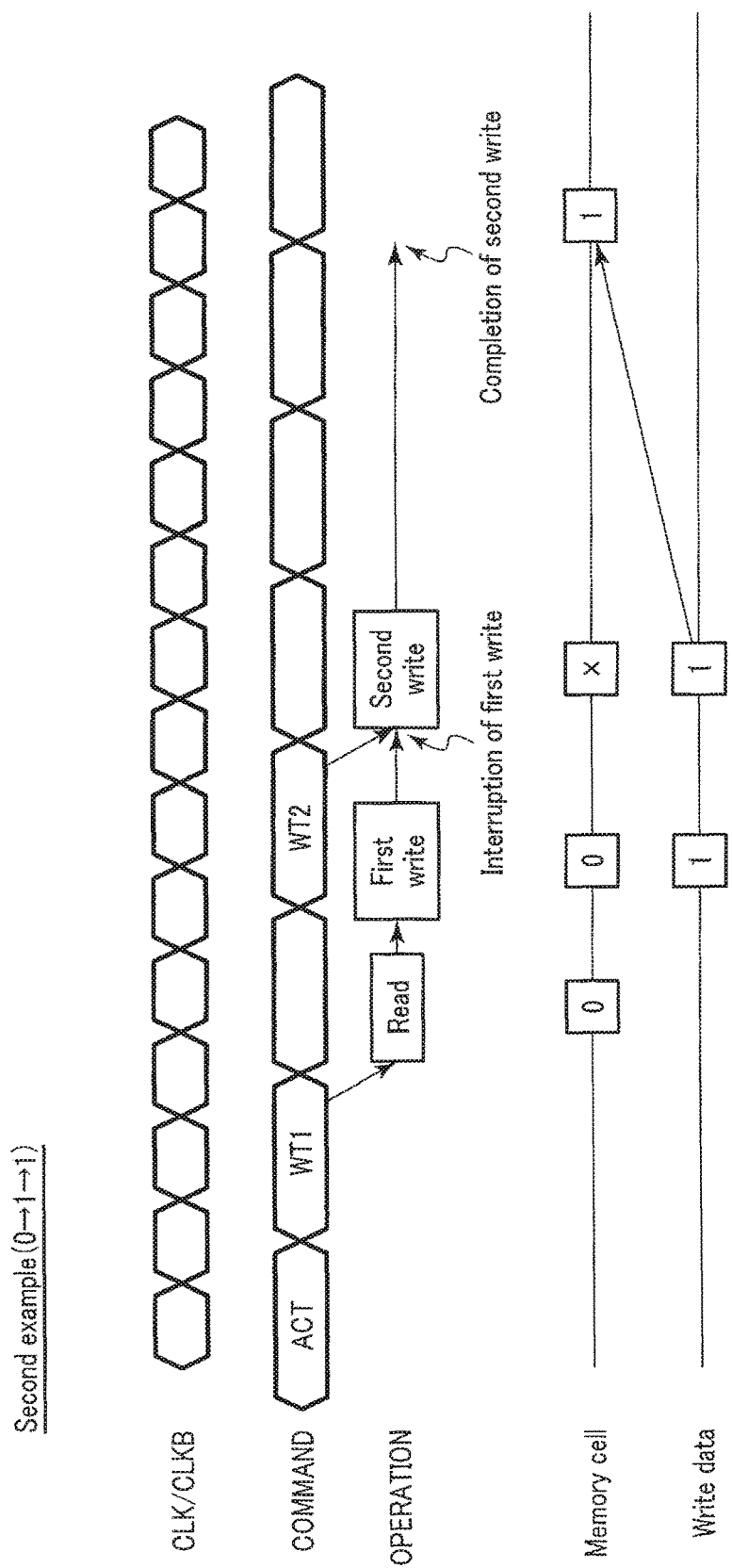
FIG. 7 is a chart showing a command sequence in a second example of write operation in the semiconductor memory device according to the embodiment.

FIG. 7 is a chart showing a command sequence in a second example of write operation in the semiconductor memory device 10 according to the embodiment. In the second example, the initial data of a memory cell MC is "0," first write data is "1" and second write data is "1." Descriptions of points of the second example, which are similar to those of the foregoing first example, will be omitted as appropriate.

Like in the first example, in the second example, read data and first write data are different in the first write as shown in FIG. 7. Thus, the write circuit 23 writes first write data "1" to the memory cell MC.

Prior to the completion of the first write, the logic controller 12 receives a write command WT2. When the write command WT2 is received, the write circuit 23 interrupts the first write and starts the second write. The write data (second write data) is "1." Since the first write is interrupted while data different from the initial data is written to the memory cell MC, the data of the memory cell MC is unknown. Thus, the write circuit 23 writes the second write data "1" to the memory cell MC. When the second write is completed, the second write data "1" is written to the memory cell MC.

The second example of the foregoing write operation will be described in detail with reference to FIGS. 4 and 8.

Figure 8:
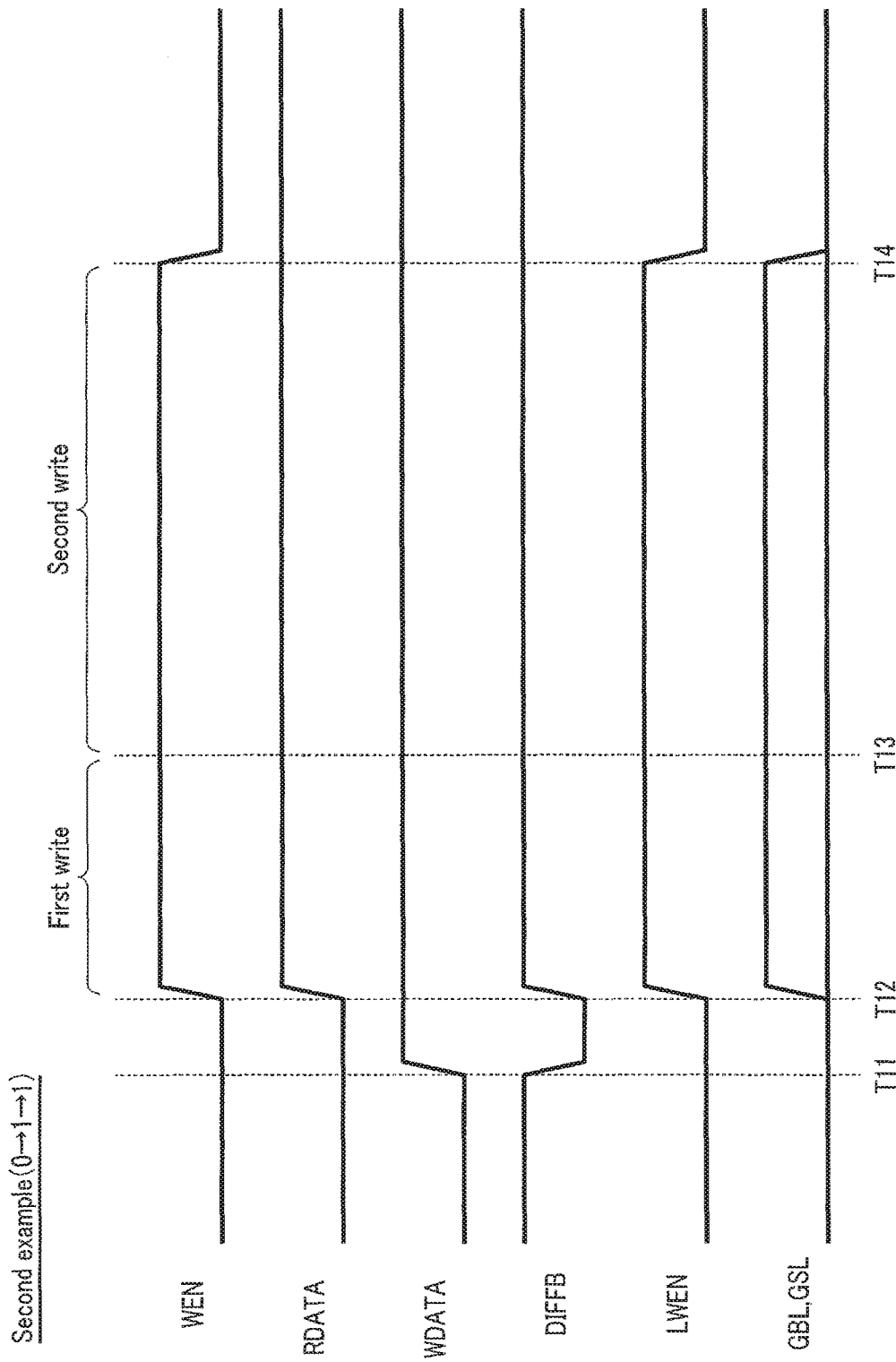
FIG. 8 is a timing chart of various signals of the second example of write operation in the semiconductor memory device according to the embodiment.

FIG. 8 is a timing chart of various signals of the second example of write operation in the semiconductor memory device 10 according to the embodiment.

As shown in FIGS. 4 and 8, first, the same operation as that at time T1 and time T2 in the first example is performed at time T11 and time T12 in the second example.

At time T13, the first write is interrupted and data "1" ("H" level) is supplied as second write data. The second write data "1" is the same as the first write data. The signal WDATA thus remains at an "H" level. Accordingly, the signal RDATA remains at an "H" level and consequently the exclusive NOR circuit ENO1 maintains the "H" level of the signal DIFFB. Since, furthermore, the signal WEN remains at an "H" level, the latch circuit LA holds the "L" level signal irrespective of the signal DIFFB. The signal LWEN thus remains at an "H" level.

Like in the first write, the signal WDATA is at an "H" level and the signal WDATAB is at an "L" level. Thus, the write driver 23c is driven, and the global bit line GBL maintains the "H" level and the global source line GSL maintains the "L" level. In other words, write current flows through a memory cell MC toward the global source line GSL from the global bit line GBL to start writing second write data "1."

When the second write is completed at time T14, the signal WEN becomes an "L" level. Accordingly, the latch circuit LA is reset and outputs an "H" level signal. The signal LWEN thus becomes an "L" level. The write driver 23c is not driven, and the global bit line GBL and the global'source line GSL both become an "L" level. The write operation in the second example is therefore completed.

Figure 9:
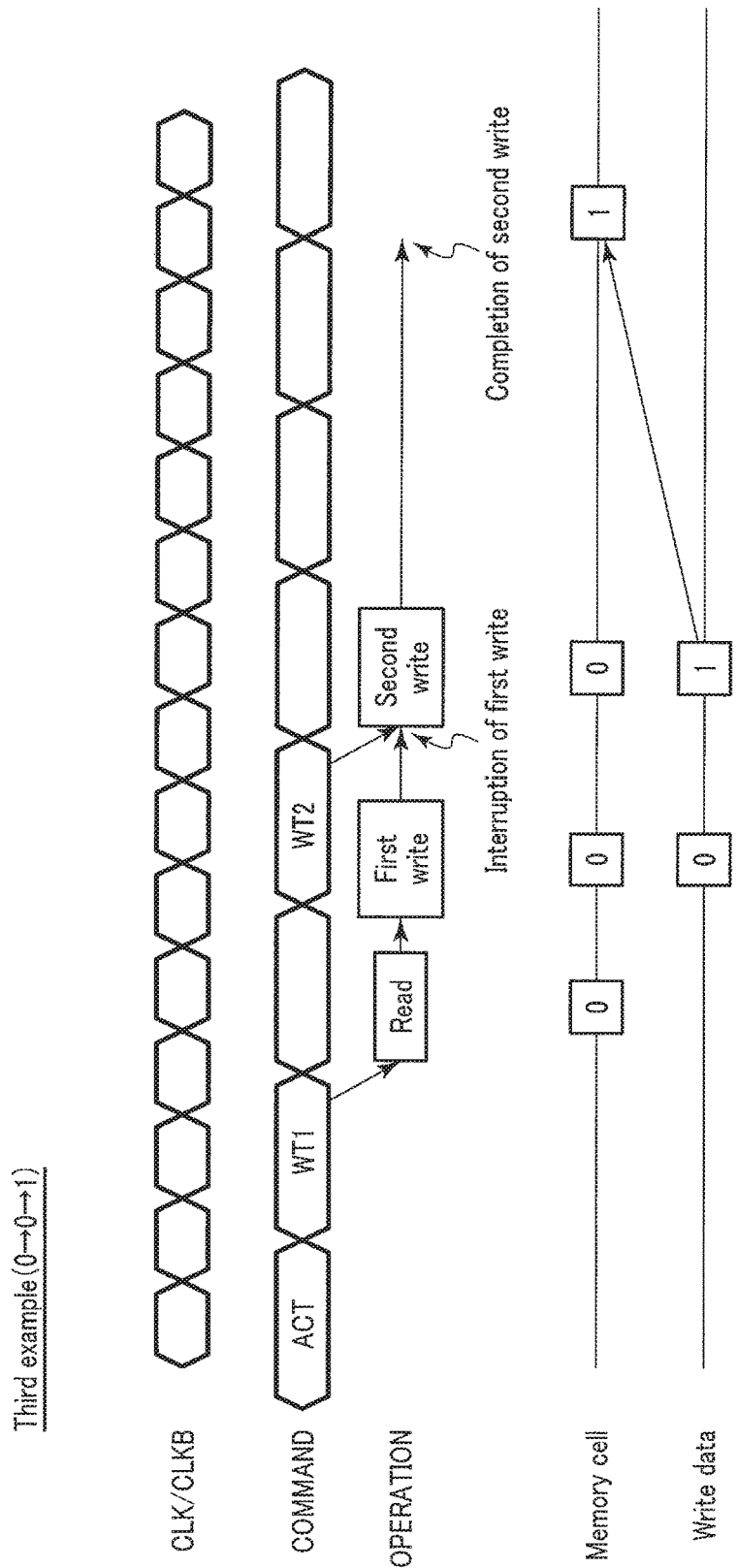
FIG. 9 is a chart showing a command sequence in a third example of write operation in the semiconductor memory device according to the embodiment.

FIG. 9 is a chart showing a command sequence in a third example of write operation in the semiconductor memory device 10 according to the embodiment. In the third example, the initial data of a memory cell MC is "0," first write data is "0" and second write data is "1." Descriptions of points of the third example, which are similar to those of the foregoing first example, will be omitted as appropriate.

Unlike in the first example, in the third example, write data in the first write (first write data) is "0" as shown in FIG. 9. Since, therefore, the read data and the first write data are the same, the write circuit 23 does not write first write data "0" to the memory cell MC.

Prior to the completion of the first write (prior to the lapse of predetermined write time), the logic controller 12 receives a write command WT2. When the write command WT2 is received, the write circuit 23 interrupts the first write and starts the second write. The write data (second write data) is "1." Since data is not written in the first write, the data of the memory cell MC is "0" same as the initial data. In the second write, therefore, the data of the memory cell MC and the second write data are different. Thus, the write circuit 23 writes the second write data "1" to the memory cell MC. When the second write is completed, the second write data "1" is written to the memory cell MC.

A third example of the foregoing write operation will be described below with reference to FIGS. 4 and 10.

FIG. 10 is a timing chart of various signals of the third example of the write operation in the semiconductor memory device 10 according to the embodiment.

As shown in FIGS. 4 and 10, first, the same operation as that before time T1 in the first example is performed before time T21 in the third example.

At time T21, data "0" ("L" level) is supplied as first write data. The first write data "0" is the same as the initial data. The signal WDATA thus maintains the "L" level. The signal RDATA maintains the "L" level and consequently the exclusive NOR circuit ENO1 maintains the "H" level of the signal DIFFB. Since the latch circuit LA outputs an "H" level signal, the signal LWEN is maintained at an "L" level.

At time T22, the signal WEN becomes an "H" level. Since, therefore, the latch circuit LA is supplied with the "H" level signal WEN and the "H" level signal DIFFB, it maintains the "H" level output signal. Accordingly, the signal LWEN is maintained at an "L" level. Thus, the write driver 23c is not driven, and the global bit line GBL and the global source line GSL both become an "L" level.

At time T23, the first write is interrupted and data "1" ("H" level) is supplied as second write data. Accordingly, the signal WDATA becomes an "H" level, with the result that the exclusive NOR circuit ENO1 sets the signal DIFFB at an "L" level.

The latch circuit LA is set and outputs an "L" level signal. In other words, the latch circuit LA outputs an "L" level signal while the signal WEN is maintained at an "H" level. Thus, the signal LWEN becomes an "H" level.

Since, at this time, the signal WDATA is at an "H" level and the signal WDATAB is at an "L" level, the write driver 23c is driven, and the global bit line GBL becomes an "H" level and the global source line GSL becomes an "L" level. In other words, write current flows through a memory cell MC toward the global source line GSL from the global bit line GBL to start writing second write data "1."

The "H" level signal LWEN is supplied to the clocked inverter CI2 and thus the "H" level signal WDATA is supplied as write data. Accordingly, the signal LDIN becomes an "L" level, with the result that the exclusive NOR circuit NO1 is supplied with the "H" level signal WDATA and the "H" level signal RDATA and thus outputs an "H" level signal DIFFB. Since the latch circuit LA is set, the "L" level signal is maintained and the signal LWEN is maintained at an "H" level.

When the second write is completed at time T24, the signal WEN becomes an "L" level. Accordingly, the latch circuit LA is reset and outputs an "H" level signal. The signal LWEN thus becomes an "L" level. The write driver 23c is not driven, and the global bit line GBL and the global source line GSL both become an "L" level. The write operation in the third example is therefore completed.

FIG. 11 is a chart showing a command sequence in a fourth example of write operation in the semiconductor memory device 10 according to the embodiment. In the fourth example, the initial data of a memory cell MC is "0," first write data is "0" and second write data is "0." In other words, all data are the same. Descriptions of points of the fourth example, which are similar to those of the foregoing first example, will be omitted as appropriate.

Unlike in the first example, in the fourth example, write data in the first write (first write data) is "0" as shown in FIG. 11. Since, therefore, the read data and the first write data are the same, the write circuit 23 does not write first write data "0" to the memory cell MC.

Prior to the completion of the first write (prior to the lapse of predetermined write time), the logic controller 12 receives a write command WT2. When the write command WT2 is received, the write circuit 23 interrupts the first write and starts the second write. The write data (second write data) is "0." Since data is not written in the first write, the data of the memory cell MC is "0" same as the initial data. In the second write, therefore, the data of the memory cell MC and the second write data are the same. Thus, the write circuit 23 does not write the second write data "0" to the memory cell MC. When the second write is completed (after a lapse of predetermined write time), the data of the memory cell MC is "0" same as the initial data.

A fourth example of the foregoing write operation will be described below with reference to FIGS. 4 and 12.

Figure 12:
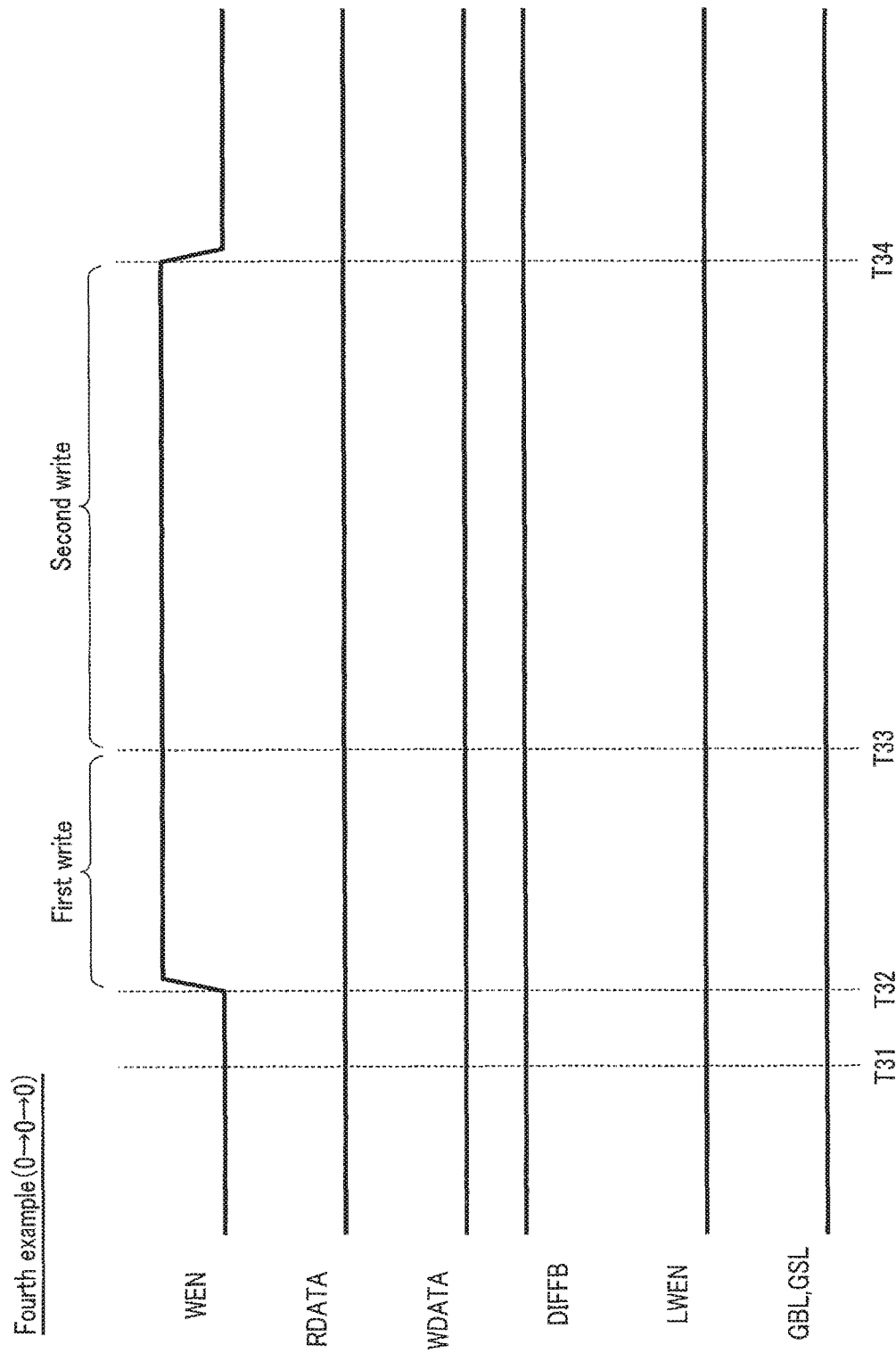
FIG. 12 is a timing chart of various signals of the fourth example of write operation in the semiconductor memory device according to the embodiment.

FIG. 12 is a timing chart of various signals of the fourth example of write operation in the semiconductor memory device 10 according to the embodiment.

As shown in FIGS. 4 and 12, first, the same operation as that before time T1 in the first example is performed before time T31 in the fourth example.

At time T31, data "0" ("L" level) is supplied as first write data. The first write data "0" is the same as the initial data. The signal WDATA is at an "L" level and the signal RDATA is also an "L" level; consequently, the exclusive NOR circuit ENO1 maintains the "H" level of the signal DIFFB. The signal LWEN is maintained at an "L" level to output an "H" level signal from the latch circuit LA.

At time T32, the signal WEN becomes an "H" level. Since, therefore, the latch circuit LA is supplied with the "H" level signal WEN and the "H" level signal DIFFB, it maintains the "H" level output signal. Accordingly, the signal LWEN is maintained at an "L" level. Thus, the write driver 23c is not driven, and the global bit line GBL and the global source line GSL both become an "L" level.

At time T33, the first write is interrupted and data "0" ("L" level) is supplied as second write data. The second write data "0" is the same as data (initial data) stored in a memory cell MC. The signal WDATA and the signal RDATA both remain at the "L" level from the first write, with the result that the exclusive NOR circuit ENO1 maintains the "H" level of the signal DIFFB. The signal LWEN is maintained at an "L" level to output an "H" level signal from the latch circuit LA. Thus, the write driver 23c is not driven, and the global bit line GBL and the global source line GSL both become an "L" level.

When the second write is completed at time T34, the signal WEN becomes an "L" level. Accordingly, the latch circuit LA maintains an "H" level output signal. The signal LWEN thus becomes an "L" level. The write driver 23c is not driven; thus, the write operation in the fourth example is completed.

Advantages of Embodiment

In the memory write operation, a write method called Read-Modify-Write is proposed. In the above-described write method, when a write command is received, data is read from a memory cell MC. Then, read data and write data are compared with each other. Only when these data are different, write data is written to the memory cell MC. When these data are the same, write data is not written to the memory cell MC.

In this write method, there is a case where before writing by a write command (first write) is completed, the next write command is received. In this case, the first write is interrupted and then the second write is performed by the next write command. At this time, there is a case where data stored in the memory cell MC becomes unknown by the interruption of the first write when the second write is started.

In the comparison example, therefore, the write driver 23c is always driven to write data to the memory cell MC in the second write. In other words, in the comparison example, when the first write is interrupted, the write driver 23c is driven irrespective of data comparison results. However, when the initial data (read data) of the memory cell MC, the first write data and the second write data are all the same (e.g. data "0"), it is unnecessary to drive the write driver 23c to write data to the memory cell MC in the second write. In other words, in the comparison example, the write driver 23c will be driven undesirably even in the case described above, which causes the problems of a decrease in reliability of the memory cell MC and an increase in power consumption due to unnecessary writing to the memory cell MC.

In contrast, according to the above embodiment, the write circuit 23 includes a latch circuit LA for holding a data comparison result (indicating a difference) while the signal WEN keeps at an "H" level. Even though the first write is interrupted, the latch circuit LA holds a data comparison result (indicating a difference) if the write driver 23c has only to be driven once based on the data comparison result. Then, the latch circuit LA outputs a signal to drive the write driver 23c based on the data comparison result held thereafter.

For example, the latch circuit LA sets the output signal LWEN at an "L" level based on the data comparison result (indicating the same) when the initial data of the memory cell MC, the first write data and the second write data are all the same (in the fourth example described above). In response to the "L" level signal LWEN, the write driver 23c is not driven in the first write or the second write, and no data is written to the memory cell MC. In other words, unnecessary write is not performed in the second write after the interruption of write, with the result that the memory cell MC can be prevented from decreasing in reliability and low power consumption can be achieved.

On the other hand, the latch circuit LA sets the signal LWEN at an "H" level in the subsequent write (first write and second write) based on the held data comparison result (indicating a difference) when the initial data and the first write data are different (in the first and second examples described above). In response to the "H" level signal LWEN, the write driver 23c is driven in the first write and the second write, and data is written to the memory cell MC. Furthermore, the latch circuit LA sets the signal LWEN at an "H" level in the subsequent write (second write) based on the held data comparison result (indicating a difference) when the initial data and the first write data are the same and the second write data is different (the third example described above). In response to the "H" level signal LWEN, the write driver 23c is driven in the second write, and data is written to the memory cell MC. In other words, when data of the memory cell MC and the write data are different or when data of the memory cell MC is unknown, necessary write is performed as appropriate.

First Modification to Embodiment

Figure 13:
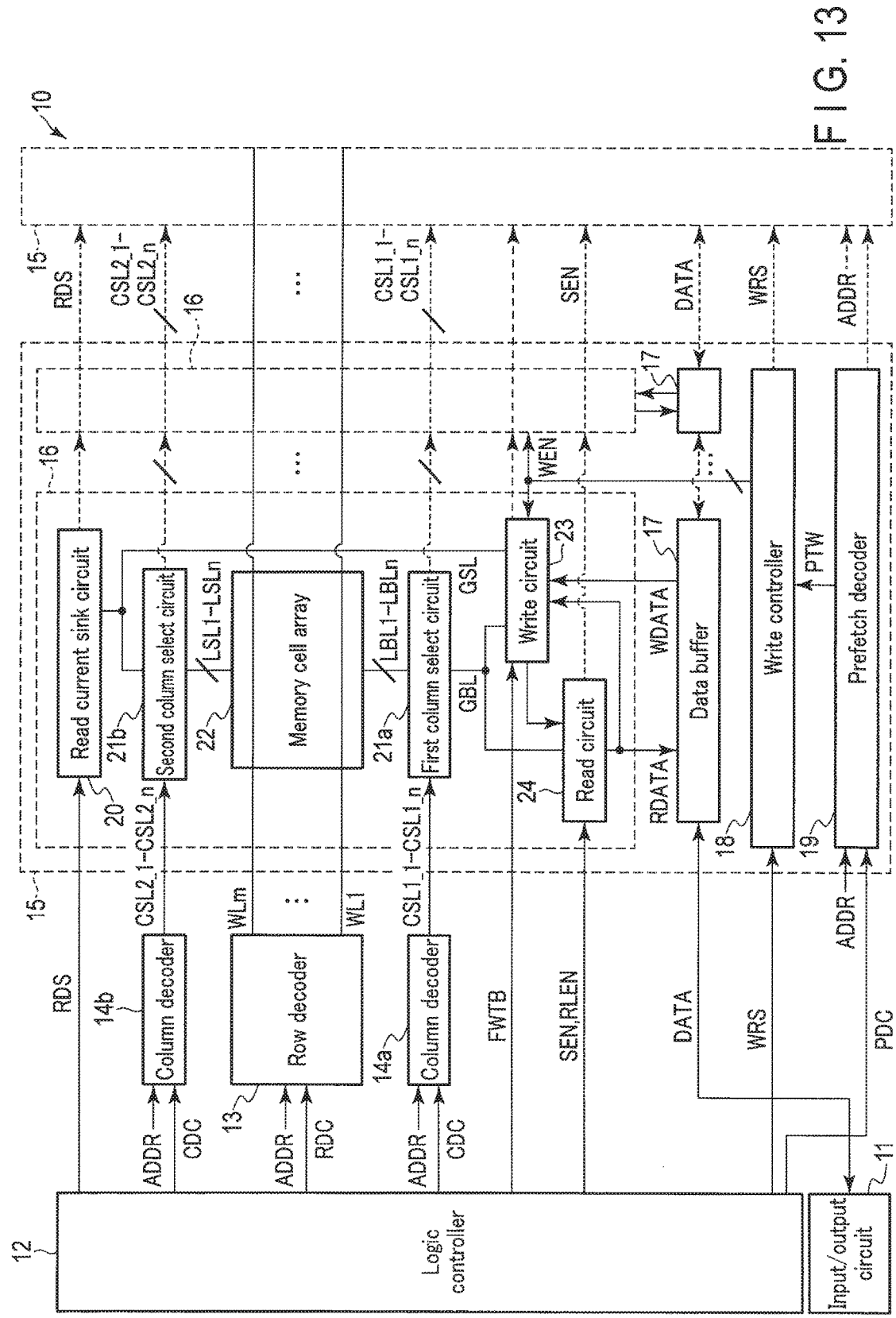
FIG. 13 is a block diagram showing a semiconductor memory device according to a first modification to the embodiment.

FIG. 13 is a block diagram showing a first modification to the semiconductor memory device 10 according to the embodiment.

As shown in FIG. 13, unlike in the foregoing embodiment, in the first modification, the logic controller 12 transmits a signal FWTB to the write circuit 23 in the memory unit 16 of each core block 15. Note that the signal FWTB can be supplied to the write circuit 23 from the write controller 18.

The signal FWTB will be described in detail below.

Figure 14:
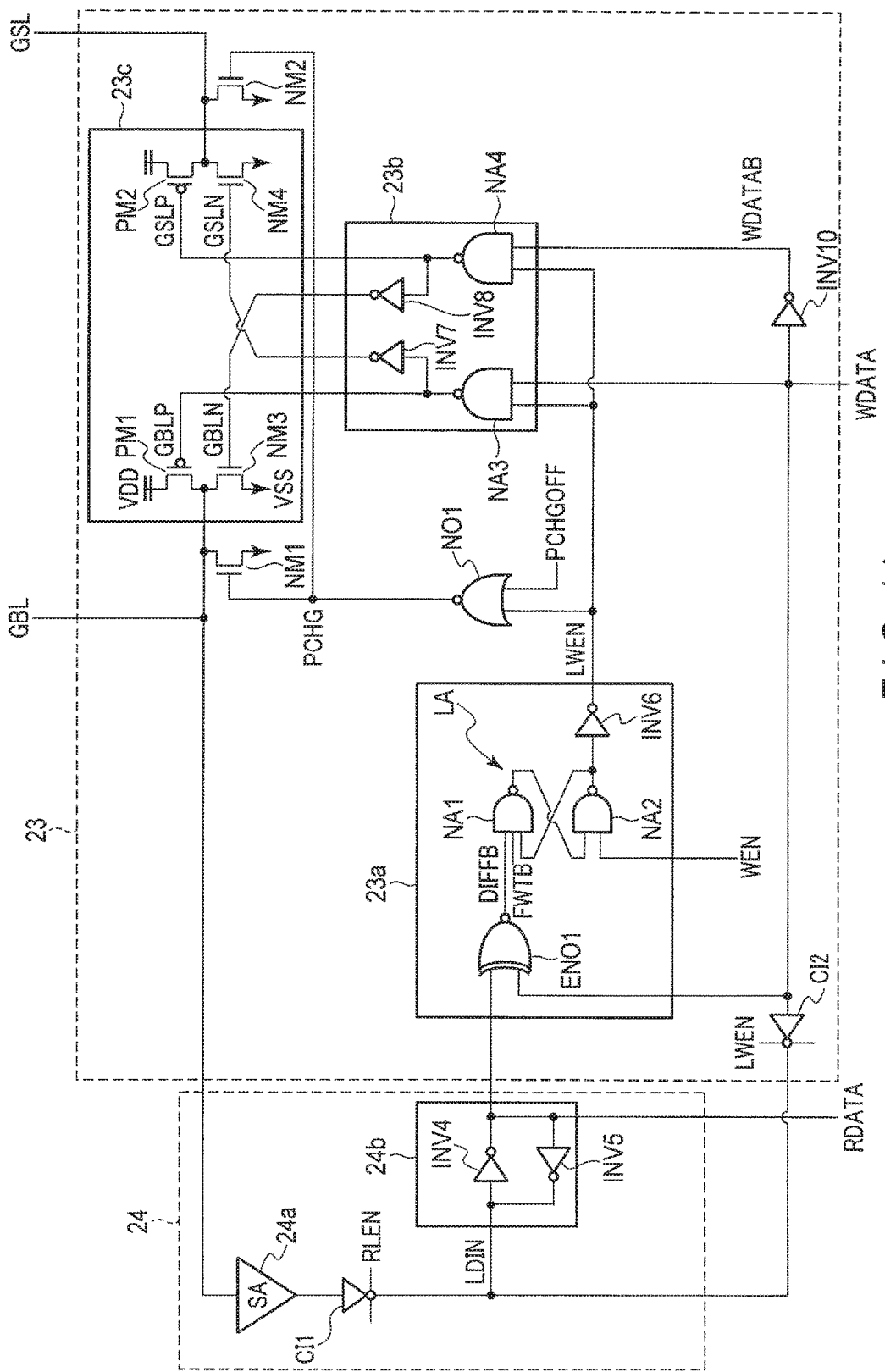
FIG. 14 is a circuit diagram showing a write circuit and a read circuit in the semiconductor memory device according the first modification to the embodiment.

FIG. 14 is a circuit diagram of the write circuit 23 and the read circuit 24 in the semiconductor memory device 10 according to the first modification to the embodiment.

As shown in FIG. 14, unlike in the foregoing embodiment, in the first modification, a signal FWTB is supplied to a third input terminal of the NAND circuit NA1.

When the signal FWTB is at an "H" level, the latch circuit LA outputs a signal based on the signal DIFFB (data comparison result) while the signal WEN is at an "H" level. More specifically, when the signal FWTB is at an "H" level, the latch circuit LA outputs an "L" level signal if the signal DIFFB is at an "L" level while the signal WEN is at an "H" level. Accordingly, the signal LWEN becomes an "H" level, and the write driver 23c is driven to write data. When the signal FWTB is at an "H" level, the latch circuit LA outputs an "H" level signal if the signal DIFFB is at an "H" level while the signal WEN is at an "H" level. Accordingly, the signal LWEN becomes an "L" level, and the write driver 23c is not driven; thus, no data is written.

When the signal FWTB is at an "L" level, the latch circuit LA outputs an "L" level signal irrespective of the signal DIFFB (data comparison result) while the signal WEN is at an "H" level. Accordingly, the signal LWEN becomes an "H" level, and the write driver 23c is driven to write data.

According to the first modification, the write driver 23c can write data irrespective of data stored in a memory cell MC. The first modification is effective in, for example, resetting data of a memory cell MC when data is read by a self-reference sensing operation.

Second Modification to Embodiment

Figure 15:
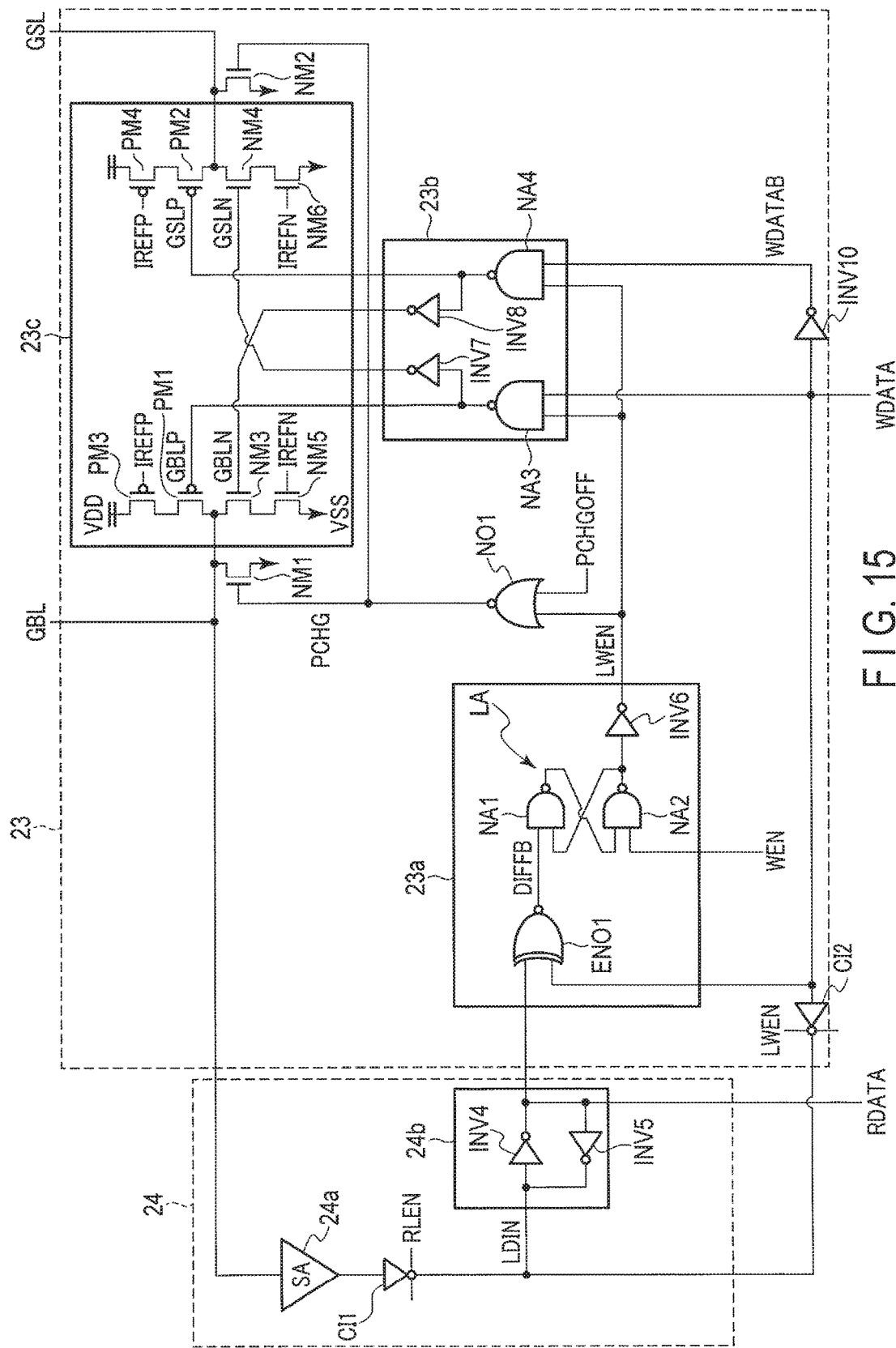
FIG. 15 is a circuit diagram showing a write circuit and a read circuit in a semiconductor memory device according a second modification to the embodiment.

FIG. 15 is a circuit diagram showing a write circuit 23 and a read circuit 24 in a semiconductor memory device 10 according a second modification to the embodiment.

Unlike in the foregoing embodiment, in the second modification, the write driver 23c includes NMOS transistors NM5 and NM6 and PMOS transistors PM3 and PM4.

The control terminal of the NMOS transistor NM5 is supplied with a signal IREFN. The first terminal of the NMOS transistor NM5 is electrically coupled to the ground voltage line and the second terminal thereof is coupled to the first terminal of the NMOS transistor NM3. The control terminal of the NMOS transistor NM6 is supplied with a signal IREFN. The first terminal of the NMOS transistor NM6 is electrically coupled to the ground voltage line and the second terminal thereof is coupled to the first terminal the NMOS transistor NM4.

The control terminal of the PMOS transistor PM3 is supplied with a signal IREFP. The first terminal of the PMOS transistor PM3 is electrically coupled to the power supply voltage line and the second terminal thereof is coupled to the first terminal of the PMOS transistor PM1. The control terminal of the PMOS transistor PM4 is supplied with a signal IREFP. The first terminal of the PMOS transistor PM4 is electrically coupled to the power supply voltage line and the second terminal thereof is coupled to the first terminal of the PMOS transistor PM2.

The signals IREFN and IREFP are analog voltage signals to cause a constant current to flow through each of the transistors. Thus, write current that flows through a memory cell MC can be made constant, regardless of the position in which the local bit line LBL and the local source line LSL are coupled.

The write driver 23c may be configured to include only the PMOS transistors PM3 and PM4 or NMOS transistors NM5 and NM6. In other words, the write driver 23c may be configured to include the PMOS transistors PM3 and PM4 and not to include the NMOS transistors NM5 and NM6, and the first terminals of the NMOS transistors NM3 and NM4 may be coupled to the ground voltage line. Alternatively, the write driver 23c may be configured to include the NMOS transistors NM5 and NM6 and not to include the PMOS transistors PM3 and PM4, and the first terminals of the PMOS transistors PM1 and PM2 may be coupled to the power supply voltage line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory cell including a first resistance change element; and
a write circuit configured to perform write to the first memory cell,
wherein the write circuit includes:
a first circuit including a first input terminal supplied with a first signal based on read data from the first memory cell and a second input terminal supplied with a second signal based on write data to the first memory cell; and
a second circuit including a first input terminal supplied with a third signal from an output terminal of the first circuit and a second input terminal supplied with a fourth signal.

2. The device of claim 1, wherein in the second circuit, the third signal as a set signal and the fourth signal as a reset signal are input signals.

3. The device of claim 1, wherein:
the second circuit includes a latch circuit including a first NAND circuit and a second NAND circuit;
the first NAND circuit includes a first input terminal supplied with the third signal and a second input terminal coupled to an output terminal of the second NAND circuit; and
the second NAND circuit includes a first input terminal coupled to an output terminal of the first NAND circuit and a second input terminal supplied with the fourth signal.

4. The device of claim 1, wherein the fourth signal is a signal based on a write command.

5. The device of claim 1, wherein the first circuit outputs the third signal according to whether a logic level of the first signal and a logic level of the second signal are equal to each other.

6. The device of claim 1, wherein the write circuit further includes a write driver configured to be driven based on a fifth signal from an output terminal of the second circuit.

7. The device of claim 6, wherein after reading, the write circuit performs first write and performs second write after an interruption of the first write, and maintains the fifth signal at a first logic level to inhibit the write driver from being driven when the read data from the first memory cell, first write data in the first write, and second write data in the second write are equal.

8. The device of claim 6, wherein after reading, the write circuit performs first write and performs second write after an interruption of the first write, and when the read data from the first memory cell and first write data in the first write are different, the write circuit maintains the fifth signal at a second logic level to drive the write driver in accordance with the first write data and drive the write driver in accordance with second write data until a transition of the fourth signal in the second write.

9. The device of claim 6, wherein after reading, the write circuit performs first write and performs second write after an interruption of the first write, and when the read data from the first memory cell and first write data in the first write are equal, the write circuit maintains the fifth signal at a first logic level to inhibit the write driver from being driven, and when the read data from the first memory cell and second write data are different in the second write, the write circuit changes the fifth signal to a second logic level to drive the write driver in accordance with second write data.

10. The device of claim 3, wherein the first NAND circuit further includes a third input terminal supplied with a sixth signal.

11. The device of claim 6, wherein the write driver includes:
a first transistor including a first terminal coupled to a power supply voltage line and a control terminal supplied with a seventh signal based on the fifth signal and write data;
a second transistor including a first terminal coupled to the power supply voltage line and a control terminal supplied with an eighth signal based on the fifth signal and write data;
a third transistor including a first terminal coupled to a ground voltage line, a second terminal coupled to a second terminal of the first transistor, and a control terminal supplied with a ninth signal based on the fifth signal and write data; and
a fourth transistor including a first terminal coupled to the ground voltage line, a second terminal coupled to a second terminal of the first transistor, and a control terminal supplied with a tenth signal based on the fifth signal and write data.

12. A semiconductor memory device comprising:
   a first memory cell including a first resistance change element; and
   a write circuit configured to write data to the first memory cell,
   wherein after reading, the write circuit performs first write and performs second write after an interruption of the first write, and maintains a first signal at a first logic level when read data from the first memory cell, first write data in the first write, and second write data in the second write are all equal, and
   wherein the write circuit further includes a write driver configured to be driven based on the first signal.

13. The device of claim 12, wherein the write circuit includes:
   a first circuit including a first input terminal supplied with a second signal based on read data from the first memory cell and a second input terminal supplied with a third signal based on write data to the first memory cell; and
   a second circuit including a first input terminal supplied with a fourth signal from an output terminal of the first circuit and a second input terminal supplied with a fifth signal.

14. The device of claim 13, wherein in the second circuit, the fourth signal as a set signal and the fifth signal as a reset signal are input signals.

15. The device of claim 13, wherein:
   the second circuit includes a latch circuit including a first NAND circuit and a second NAND circuit;
   the first NAND circuit includes a first input terminal supplied with the fourth signal and a second input terminal coupled to an output terminal of the second NAND circuit; and
   the second NAND circuit includes a first input terminal coupled to an output terminal of the first NAND circuit and a second input terminal supplied with the fifth signal.

16. The device of claim 13, wherein the fifth signal is a signal based on a write command.

17. The device of claim 13, wherein the first circuit outputs the fourth signal according to whether a logic level of the second signal and a logic level of the third signal are equal to each other.

* * * * *